United States Patent
Ha

(10) Patent No.: US 10,804,322 B2
(45) Date of Patent: Oct. 13, 2020

(54) CROSS-POINT ARRAY DEVICE AND METHOD OF MANUFACTURING THE SAME

(71) Applicant: SK hynix Inc., Icheon (KR)

(72) Inventor: Tae Jung Ha, Icheon (KR)

(73) Assignee: SK hynix Inc., Icheon (KR)

( * ) Notice: Subject to any disclaimer, the term of this patent is extended or adjusted under 35 U.S.C. 154(b) by 48 days.

(21) Appl. No.: 16/172,504

(22) Filed: Oct. 26, 2018

(65) Prior Publication Data

US 2019/0259812 A1 Aug. 22, 2019

(30) Foreign Application Priority Data

Feb. 20, 2018 (KR) .................. 10-2018-0020074

(51) Int. Cl.
*H01L 27/24* (2006.01)
*H01L 45/00* (2006.01)

(52) U.S. Cl.
CPC ...... *H01L 27/2463* (2013.01); *H01L 27/2409* (2013.01); *H01L 45/08* (2013.01); *H01L 45/124* (2013.01); *H01L 45/1253* (2013.01); *H01L 45/1266* (2013.01); *H01L 45/145* (2013.01); *H01L 45/1608* (2013.01); *H01L 45/1675* (2013.01); *H01L 45/1683* (2013.01); *H01L 45/16* (2013.01)

(58) Field of Classification Search
None
See application file for complete search history.

(56) References Cited

U.S. PATENT DOCUMENTS

| | | | |
|---|---|---|---|
| 7,952,914 B2 * | 5/2011 | Baek | G11C 11/1675 365/100 |
| 8,674,332 B2 | 3/2014 | Toh et al. | |
| 8,921,818 B2 * | 12/2014 | Tu | H01L 45/08 257/4 |
| 2011/0095257 A1 * | 4/2011 | Xu | H01L 21/02115 257/3 |
| 2017/0162786 A1 | 6/2017 | Lee et al. | |

* cited by examiner

*Primary Examiner* — Andres Munoz

(57) ABSTRACT

A cross-point array device includes a substrate, a first conductive line disposed over the substrate and extending in a first direction, a plurality of pillar structures disposed on the first conductive line, each of the pillar structure comprising a memory electrode, a resistive memory layer disposed along surfaces of the pillar structures, a threshold switching layer disposed on the resistive memory layer, and a second conductive line electrically connected to the threshold switching layer and extending a second direction that is not parallel to the first conductive line.

22 Claims, 32 Drawing Sheets

… (1)

CROSS-POINT ARRAY DEVICE AND METHOD OF MANUFACTURING THE SAME

CROSS-REFERENCE TO RELATED APPLICATION

The present application claims priority under 35 U.S.C 119(a) to Korean Patent Application No. 10-2018-0020074, filed on Feb. 20, 2018, which is incorporated by reference herein in its entirety.

BACKGROUND

1. Technical Field

Various embodiments of the present disclosure generally relate to a semiconductor device, and more particularly, relate to a cross-point array device and a method of manufacturing the same.

2. Related Art

A cross-point array device may include a pair of conductive lines crossing on different planes and a unit cell in the form of a pillar structure disposed in an intersection region of the pair of conductive lines. Recently, the cross-point array device has been applied to nonvolatile memory devices requiring highly integrated memory cells. Specifically, the nonvolatile memory devices may include a resistive random access memory (ReRAM) device, a phase change random access memory (PcRAM) device, a magnetic random access memory (MRAM) device, and the like.

Meanwhile, in a nonvolatile memory device having a cross-point memory array structure, there may be writing errors or reading errors on cell information due to an undesired sneak current that may be generated between adjacent unit memory cells. In order to prevent the writing errors or the reading errors from occurring due to the undesired sneak current, in a unit cell structure, a selection element has been proposed to control a current or voltage applied to a memory element.

SUMMARY

There is disclosed a cross-point array device according to one aspect of the present disclosure is disclosed. The cross-point array device includes a substrate, a first conductive line disposed over the substrate and extending in a first direction, a plurality of pillar structures disposed on the first conductive line, each of the pillar structures comprising a memory electrode, a resistive memory layer disposed along surfaces of the pillar structures, a threshold switching layer disposed on the resistive memory layer, and a second conductive line electrically connected to the threshold switching layer and extending in a second direction that is non-parallel to the first direction. The memory layer covers at least a portion of a side surface of each of the pillar structures.

There is disclosed a cross-point array device according to another aspect of the present disclosure is disclosed. The cross-point array device includes a substrate, a first conductive line disposed over the substrate, a plurality of pillar structures disposed on the first conductive line, each of the pillar structures comprising a memory electrode, a resistive memory layer disposed on an outer surface of the pillar structures, a threshold switching layer covering the resistive memory layer, and a second conductive line disposed in a trench in the threshold switching layer and contacting the pillar structure.

There is disclosed a method of manufacturing a cross-point array device according to one aspect of the present disclosure is disclosed. In the method, a substrate is provided. A first conductive line extending in a first direction is formed over the substrate. A plurality of pillar structures is formed on the first conductive line, each of the pillar structures including a memory electrode layer. A resistive memory layer is formed on side surfaces of the pillar structures. A threshold switching layer filling spaces between the pillar structures is formed. The threshold switching layer is formed on the resistive memory layer. A trench extending a second direction is formed in the threshold switching layer. The second direction is non-parallel to the first direction. A second conductive line is formed in the trench.

DETAILED DESCRIPTION

Figure 1:
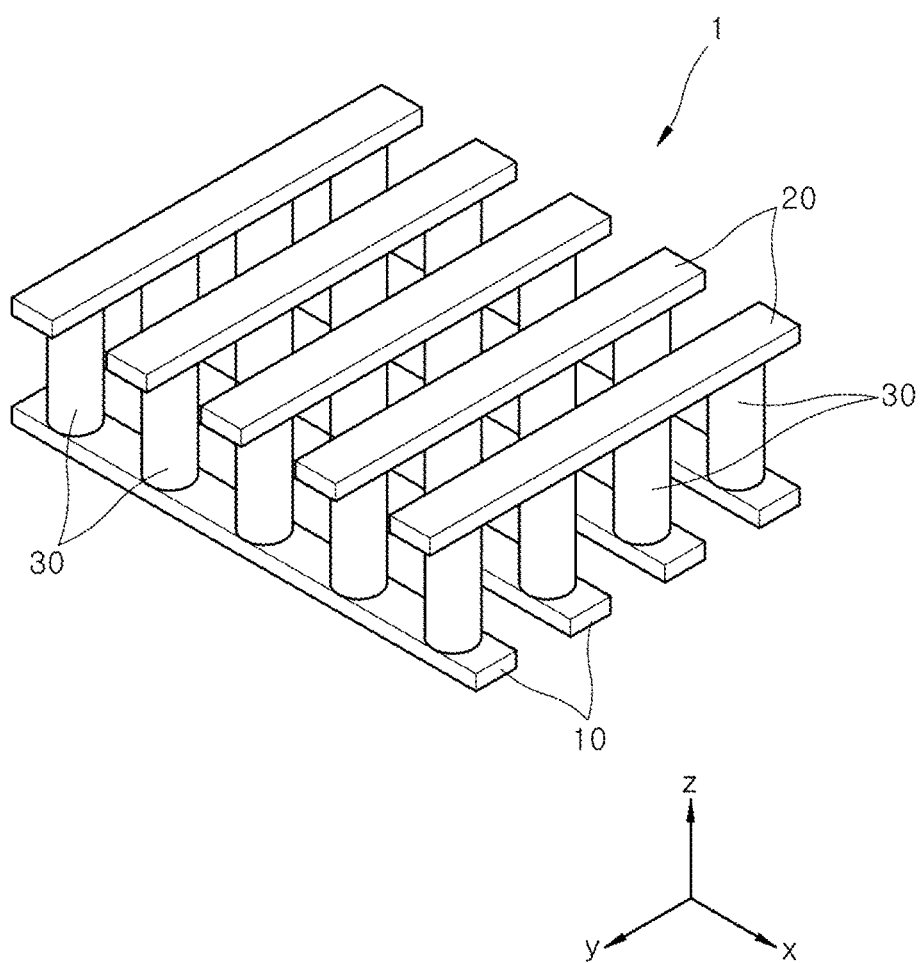
FIG. 1 is a perspective view schematically illustrating a cross-point array device according to an embodiment of the present disclosure.

Various embodiments will now be described hereinafter with reference to the accompanying drawings. In the drawings, the dimensions of layers and regions may be exaggerated for clarity of illustration. The drawings are described with respect to an observer's viewpoint. If an element is referred to be located on another element, it may be understood that the element is directly located on the other element, or an additional element may be interposed between the element and the other element. The same reference numerals refer to the same elements throughout the specification.

In addition, expression of a singular form of a word should be understood to include the plural forms of the word unless clearly used otherwise in the context. It will be understood that the terms "comprise" or "have" are intended to specify the presence of a feature, a number, a step, an operation, an element, a part, or combinations thereof, but not used to preclude the presence or possibility of addition one or more other features, numbers, steps, operations, components, parts, or combinations thereof.

Further, in performing a method or a manufacturing method, each process constituting the method can take place differently from the stipulated order unless a specific sequence is described explicitly in the context. In other words, each process may be performed in the same manner as stated order, may be performed substantially at the same time, or may be performed in a reverse order.

A threshold switching operation described herein is an operation in which, when an external voltage applied to a predetermined threshold switching layer is equal to or higher than a threshold voltage and thus the threshold switching layer is electrically turned on, the density of a current passing through the threshold switching layer has a value that is equal to or greater than a predetermined reference value, and, when the applied voltage is lower than the threshold voltage and thus the threshold switching layer is electrically turned off, the density of the current passing through the threshold switching layer has a value that is smaller than the reference value. That is, the threshold switching operation may be a non-memory switching operation with volatility. The threshold switching layer may constitute a selection element of a cross-point array device.

A resistive memory layer described herein is a layer whose internal resistance varies depending on a magnitude or polarity of an external voltage applied thereto. The resistive memory layer stores the internal resistance in a nonvolatile manner. The resistive memory layer may constitute a nonvolatile memory element of the cross-point array device.

FIG. 1 is a perspective view schematically illustrating a cross-point array device 1 according to an embodiment of the present disclosure. For illustrative convenience, a substrate and a plurality of insulating layers disposed in the cross-point array device 1 are omitted in FIG. 1. In an embodiment, the cross-point array device 1 may include a nonvolatile memory element such as a resistive RAM element, a phase change RAM element, a magnetic RAM element, or the like. In addition, the cross-point array device 1 may include a selection element electrically connected in series to the nonvolatile memory element and performing a threshold switching operation.

Referring to FIG. 1, the cross-point array device 1 may include first conductive lines 10 extending in a first direction, for example, an x-direction, second conductive lines 20 extending in a second direction, for example, a y-direction, and pillar structures 30 disposed along a third direction, for example, a z-direction, in intersection regions of the first conductive lines 10 and the second conductive lines 20. Although, in the illustrated embodiment, the first and second directions are illustrated in a rectangular coordinate system in which the first and second directions are orthogonal to each other, the present disclosure is not necessarily limited thereto and various modifications can be made as long as a condition that the first and second directions are not parallel to each other is satisfied.

A unit cell of the cross-point array device 1 may be disposed in each of the pillar structures 30. Therefore, the pillar structures 30 may form a cell array including a plurality of unit cells along the first direction and the second direction.

A unit cell disposed in a pillar structure 30 can store, as a data signal, an electrical resistance state implemented by a voltage applied between first and second conductive lines 10 and 20 coupled to the unit cell. In some embodiments, the first and second conductive lines 10 and 20 and the pillar structure 30 may be variously modified. Hereinafter, according to an embodiment of the present disclosure, there is provided a cross-point array device capable of ensuring operational reliability of the unit cell.

Figure 2A:
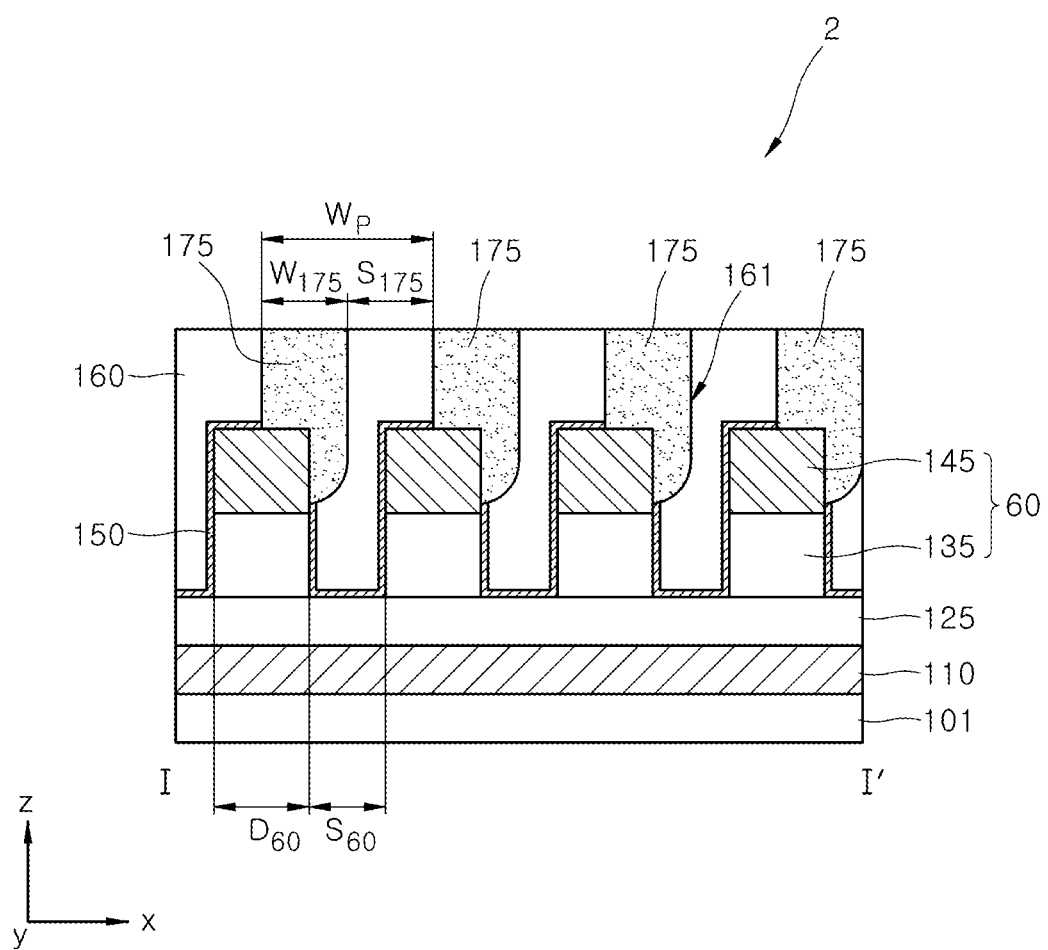
FIG. 2A is a cross-sectional view schematically illustrating a cross-point array device according to an embodiment of the present disclosure.
Figure 2B:
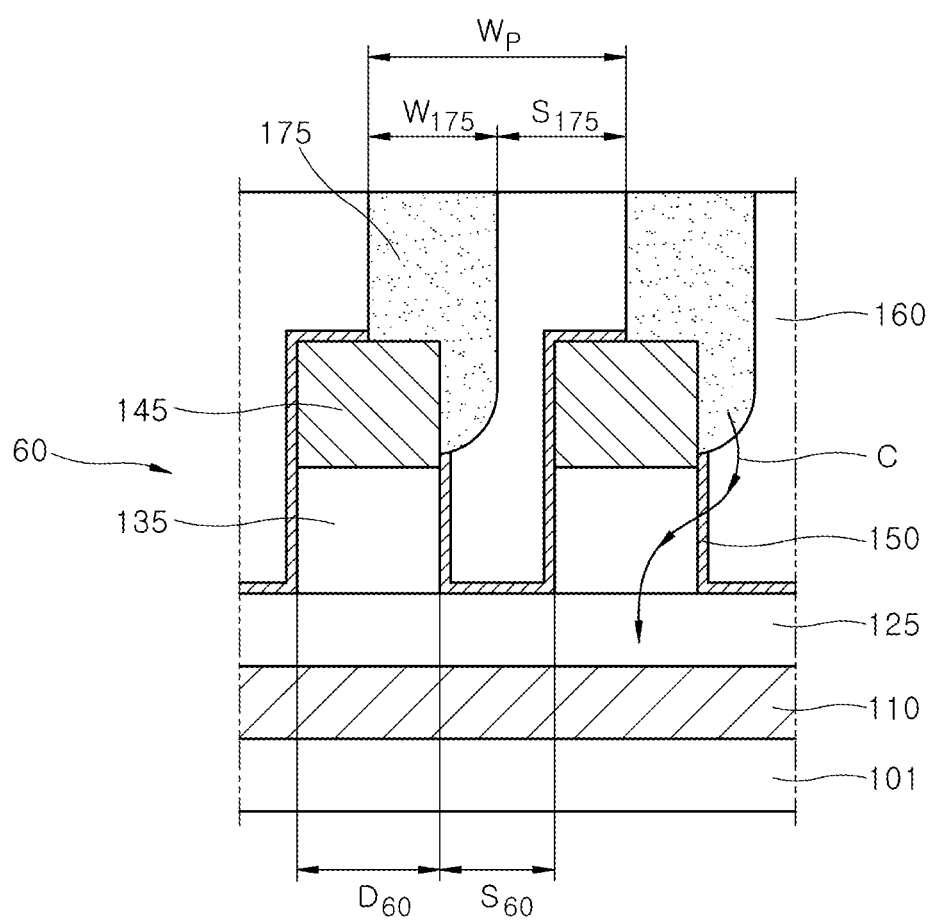
FIG. 2B is a partially enlarged view of the cross-point array device of FIG. 2A.
Figure 2C:
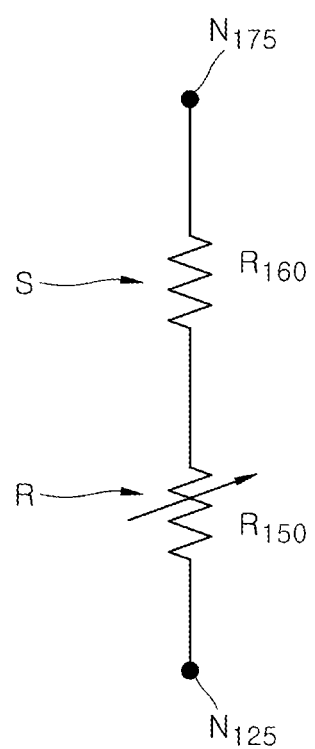
FIG. 2C is a circuit diagram of the cross-point array device of FIG. 2A.

FIG. 2A is a cross-sectional view schematically illustrating a cross-point array device 2 according to an embodiment of the present disclosure. FIG. 2B is a partially enlarged view of the cross-point array device 2 of FIG. 2A. FIG. 2C is a circuit diagram of the cross-point array device 2 of FIG. 2A.

Referring to FIG. 2A, the cross-point array device 2 may include a substrate 101, first conductive lines 125, a plurality of pillar structures 60, and second conductive lines 175. Each of the pillar structures 60 includes a memory electrode layer 135 and a hard mask layer 145. The plurality of pillar structures 60 are disposed in intersection regions of the first conductive lines 125 and the second conductive lines 175.

The cross-point array device 2 may further include a resistive memory layer 150 and a threshold switching layer 160. When a voltage is applied between the first conductive line 125 and the second conductive line 175, the resistive memory layer 150 and the threshold switching layer 160 may perform a nonvolatile memory operation and a threshold switching operation, respectively.

In an embodiment, the substrate 101 may include a semiconductor material. Specifically, the substrate 101 may be a silicon (Si) substrate, a gallium arsenide (GaAs) substrate, an indium phosphide (InP) substrate, a germanium (Ge) substrate, a silicon germanium (SiGe) substrate, a silicon-on-insulator (SOI) substrate, or the like. The substrate 101 may be a substrate doped with an n-type dopant or a p-type dopant. In an embodiment, the substrate 101 may be a silicon substrate doped with a p-type dopant. In some other embodiments, the substrate 101 may be an insulating substrate or a conductive substrate. The conductive substrate may be a metal substrate or a conductive oxide substrate.

The cross-point array device 2 may further include a first insulating layer 110 that is disposed between the substrate 101 and the first conductive lines 125. The first insulating layer 110 may include a silicon oxide, a silicon nitride, or a silicon oxynitride. The first insulating layer 110 may electrically insulate the first conductive lines 125 from the substrate 101. In an embodiment, when the substrate 101 is an insulating substrate, the first insulating layer 110 can be omitted. Although not illustrated, at least one wiring layer may be disposed between the substrate 101 and the first insulating layer 110. Alternatively, a via may be disposed in the first insulating layer 110.

The first conductive line 125 extending in a first direction may be disposed on the first insulating layer 110. In an embodiment, the first direction may be an x-direction. The first conductive line 125 may include a metal, a conductive metal nitride, or a conductive metal oxide. The first conductive line 125 may include gold (Au), platinum (Pt), copper (Cu), aluminum (Al), silver (Ag), ruthenium (Ru), titanium (Ti), iridium (Ir), tungsten (W), titanium nitride (TiN), tantalum nitride (TaN), ruthenium oxide ($RuO_2$), or the like.

The first pillar structures 60 may be disposed on the first conductive lines 125. A plurality of first pillar structures 60 may be disposed along the first direction on a corresponding one of the first conductive lines 125. Each of the first pillar structures 60 may include a memory electrode layer 135 and a hard mask layer 145. The memory electrode layer 135 may have electrical conductivity. The memory electrode layer 135 may serve as an electrode for the resistive memory layer 150. The memory electrode layer 135 may include tantalum, hafnium, titanium, or a combination thereof. The memory electrode layer 135 may be a metal layer such as a tantalum layer, a hafnium layer, or a titanium layer. The memory electrode layer 135 may be electrically connected to the first conductive line 125.

In an embodiment, when a first write voltage such as a forming voltage or a set voltage is applied between the first conductive line 125 and the second conductive line 175, the memory electrode layer 135 disposed between the first conductive line 125 and the second conductive line 175 can facilitate the creation of oxygen vacancies in the resistive memory layer 150 by trapping therein oxygen of the resistive memory layer 150. In an embodiment, when the first write voltage is applied, metal in the memory electrode layer 135, which is close to an interface of the memory electrode layer 135 and the resistive memory layer 150, captures oxygen from the resistive memory layer 150, such that the oxygen concentration inside the resistive memory layer 150 can be reduced. Accordingly, oxygen vacancies can be generated inside the resistive memory layer 150 near the interface. At this time, the oxygen vacancies may move along an electric field generated by the forming voltage or the set voltage and thus a conductive filament is generated in the resistive memory layer 150.

The conductive filament includes the oxygen vacancies and functions as a path for transferring electrons, such that the conductive filament may have electrical conductivity. When the conductive filament connects the memory electrode layer 135 to the threshold switching layer 160, a resistance state of the resistive memory layer 150 may be changed from a high resistance state to a low resistance state.

In another embodiment, when a second write voltage such as a reset voltage is applied between the first conductive line 125 and the second conductive line 175, an electric field formed by the second write voltage may disassemble at least a portion of the conductive filament generated inside the resistive memory layer 150. When at least a portion of the conductive filament is disassembled, the conductive path connecting the memory electrode layer 135 and the threshold switching layer 160 may be disconnected. As a result, the resistance state of the resistive memory layer 150 may be changed from a low resistance state to a high resistance state.

The hard mask layer 145 may be disposed on the memory electrode layer 135. The hard mask layer 145 may electrically insulate the second conductive line 175 from the memory electrode layer 135. The hard mask layer 145 may include an oxide, a nitride, or an oxynitride. As an example, the hard mask layer 145 may be a silicon nitride layer.

The resistive memory layer 150 may be disposed along a surface of the pillar structure 60. In an embodiment, the resistive memory layer 150 may be disposed on an outer surface of the pillar structure 60. The resistive memory layer 150 may cover at least a portion of a side surface of the pillar structure 60. The resistive memory layer 150 may be disposed between the memory electrode layer 135 and the threshold switching layer 160 in a lateral direction or the x-direction that is parallel to a top surface of the substrate 101. The resistive memory layer 150 may have a thickness of around 1 nm to around 10 nm. An internal resistance of the resistive memory layer 150 may be changed by the first and second write voltages applied between the first and second conductive lines 125 and 175. The changed internal resistance of the resistive memory layer 150 may be maintained in the resistive memory layer 150 even after the applied voltage is removed, so that a nonvolatile memory operation can be performed by the resistive memory layer 150.

In an embodiment, the resistive memory layer 150 may include a metal oxide. The metal oxide may include a titanium oxide, an aluminum oxide, a nickel oxide, a copper oxide, a zirconium oxide, a manganese oxide, a hafnium oxide, a tungsten oxide, a tantalum oxide, a niobium oxide, an iron oxide, or a combination thereof.

In an embodiment, the metal oxide of the resistive memory layer 150 may include oxygen vacancies. That is, an amount of metal in the metal oxide of this embodiment may be relatively greater than an amount of oxygen, when comparing the amount of metal and the amount of oxygen, which satisfies the stoichiometric ratio. The oxygen vacancies may have electric charges and thus, when the voltage is applied between the first and second conductive lines 125 and 175, the oxygen vacancies can migrate in the metal oxide of the resistive memory layer 150 along an electric field generated by the applied voltage.

In an embodiment, when the first write voltage such as the forming voltage or the set voltage is applied to the resistive memory layer 150, oxygen vacancies may be generated in the resistive memory layer 150, and the oxygen vacancies may form a conductive filament electrically connecting the memory electrode layer 135 to the threshold switching layer 160. Accordingly, the resistance state of the resistive memory layer 150 may be changed from a high resistance state to a low resistance state. The conductive filament may remain in the resistive memory layer 150 to connect the memory electrode layer 135 to the threshold switching layer 160 even after the applied voltage is removed. That is, the resistive memory layer 150 may have a nonvolatile characteristic.

In another embodiment, when the second write voltage such as the reset voltage is applied to the resistive memory layer 150, at least a portion of the conductive filament may be disassembled. Accordingly, the resistance state of the resistive memory layer 150 may be changed from a low resistance state to a high resistance state.

The threshold switching layer 160 may be disposed on the resistive memory layer 150. In an embodiment, the threshold switching layer 160 may be formed to fill spaces between the plurality of pillar structures 60 on which the resistive memory layer 150 is formed. The threshold switching layer 160 may cover the resistive memory layer 150. For example, the threshold switching layer 160 may surround the resistive memory layer 150. The threshold switching layer 160 may include a metal oxide, a metal nitride, a chalcogenide-based material, or a combination thereof. The metal oxide may include a silicon oxide, an aluminum oxide, a zirconium oxide, a hafnium oxide, a tungsten oxide, a titanium oxide, a nickel oxide, a copper oxide, a manganese oxide, a tantalum oxide, a niobium oxide, an iron oxide, or the like. In an embodiment, the metal oxide may be doped with a dopant. The dopant may include boron (B), nitrogen (N), carbon (C), phosphorus (P), aluminum (Al), lanthanum (La), niobium (Nb), vanadium (V), tantalum (Ta), tungsten (W), chromium (Cr), molybdenum (Mo), or a combination thereof. The metal nitride may include silicon nitride.

In an embodiment, the chalcogenide-based material may include a germanium-antimony-tellurium (Ge—Sb—Te)-based material. The germanium-antimony-tellurium (Ge—Sb—Te)-based material may include $Ge_2Sb_2Te_5$, $GeSb_2Te_4$, $GeSb_4Te$, or the like. In some other embodiments, the chalcogenide-based material may include germanium-tellurium (Ge—Te), indium-selenium (In—Se), antimony-tellurium (Sb—Te), arsenic-tellurium (As—Te), aluminum-tellurium (Al—Te), germanium-antimony-tellurium (Ge—Sb—Te), tellurium-germanium-arsenic (Te—Ge—As), indium-antimony-tellurium (In—Sb—Te), tellurium-tin-selenium (Te—Sn—Se), germanium-selenium-gallium (Ge—Se—Ga), bismuth-selenium-antimony (Bi—Se—Sb), gallium-selenium-tellurium (Ga—Se—Te), tin-antimony-tellurium (Sn—Sb—Te), tellurium-germanium-antimony-sulfur (Te—Ge—Sb—S), tellurium-germanium-tin-oxygen (Te—Ge—Sn—O), tellurium-germanium-tin-gold (Te—Ge—Sn—Au), palladium-tellurium-germanium-tin (Pd—Te—Ge—Sn), indium-selenium-titanium-cobalt (In—Se—Ti—Co), germanium-antimony-tellurium-palladium (Ge—Sb—Te—Pd), germanium-antimony-tellurium-cobalt (Ge—Sb—Te—Co), antimony-tellurium-bismuth-selenium (Sb—Te—Bi—Se), silver-indium-antimony-tellurium (Ag—In—Sb—Te), germanium-antimony-selenium-tellurium (Ge—Sb—Se—Te), germanium-tin-antimony-tellurium (Ge—Sn—Sb—Te), germanium-tellurium-tin-nickel (Ge—Te—Sn—Ni), germanium-tellurium-tin-palladium (Ge—Te—Sn—Pd), germanium-tellurium-tin-platinum (Ge—Te—Sn—Pt), or the like.

The threshold switching layer 160 may be in a high resistance state when no voltage is applied to the threshold switching layer 160. When the voltage applied between the first and second conductive lines 125 and 175 is increased to a predetermined threshold switching voltage or higher, the threshold switching layer 160 may be turned on and converted from the high resistance state to a low resistance state. After that, when the voltage applied between the first and second conduction lines 125 and 175 is decreased to be below the predetermined threshold switching voltage again, the threshold switching layer 160 may be turned off and converted from the low resistance state to the high resistance state. That is, the threshold switching layer 160 performs the threshold switching operation. The threshold switching voltage of the threshold switching layer 160 may be lower than the first and second write voltages applied to the resistive memory layer 150. Accordingly, the write operation of the resistive memory layer 150 can be performed when the threshold switching layer 160 is being turned on.

In an embodiment, the threshold switching layer 160 may be formed to cover the pillar structures 60. That is, the threshold switching layer 160 may surround side portions and upper portions of the pillar structures 60. The threshold switching layer 160 may include trenches 161 extending in a second direction that is not parallel to the first direction. For example, the second direction may be a direction perpendicular to the first direction. In a specific embodiment, the plurality of trenches 161 extending in a y-direction may be disposed to be spaced apart from each other at regular intervals in the x-direction. A predetermined area of each of the pillar structures 60 may be exposed by a corresponding one of the trenches 161. For example, the trench 161 may expose portions of a top surface and a side surface of each of the hard mask layers 145. In a process of forming the trenches 161, a portion of the resistive memory layer 150 disposed on the pillar structure 60 may be removed.

The second conductive line 175 may be disposed in each of the trenches 161, such that the second conductive line 175 may contact the threshold switching layer 160. In an embodiment, the second conductive line 175 may fill the trench 161. Thus, the second conductive line 175 may extend in the second direction, that is, the y-direction. The second conductive line 175 may be formed to contact a portion of the pillar structure 60 that is exposed by the trench 161. For example, the second conductive line 175 may contact the exposed portions of the top surface and the side surface of the hard mask layer 145. However, at this time, the second conductive line 175 may be electrically insulated from the memory electrode layer 135 by the hard mask layer 145. The second conductive line 175 may contact a portion of the resistive memory layer 150 that is exposed when the trench 161 is formed.

The second conductive line 175 may include a metal, a conductive metal nitride, or a conductive metal oxide. The second conductive line 175 may include gold (Au), platinum (Pt), copper (Cu), aluminum (Al), silver (Ag), ruthenium (Ru), titanium (Ti), iridium (Ir), tungsten (W), titanium nitride (TiN), tantalum nitride (TaN), ruthenium oxide ($RuO_2$), or the like.

Hereinafter, a method of operating a cross-point array device will be described with reference to FIGS. 2A, 2B, and 2C. The cross-point array device 2 may include the memory electrode layer 135, the resistive memory layer 150, and the threshold switching layer 160 that are disposed between the first conductive line 125 and the second conductive line 175. When a read voltage or the first or second write voltage is applied between the first conductive line 125 and the second conductive line 175, an electron flow C illustrated in FIG. 2B may occur. For example, electrons originating from the second conductive line 175 may pass through the threshold switching layer 160 outside the pillar structure 60 and then reach the resistive memory layer 150 disposed on a side surface of the pillar structure 60. Then, the electrons may pass through the resistive memory layer 150 and the memory electrode layer 135 and then reach the first conductive line 125.

As illustrated in FIG. 2C, the resistive memory layer 150 and the threshold switching layer 160 of FIGS. 2A and 2B may correspond to a variable resistance memory element R and a selection element S, respectively, that are disposed between a first node N125 and a second node N175. The first node N125 and the second node N175 may correspond to the first conductive line 125 and the second conductive line 175, respectively. The variable resistance memory element R and the selection element S may have a variable resistance $R_{150}$ and a switching resistance $R_{160}$, respectively. As described above in connection with FIGS. 2A and 2B, the variable resistance memory element R and the selection element S may be electrically connected in series to each other.

In this embodiment described above in connection with FIGS. 2A, 2B, and 2C, the resistive memory layer 150 may be disposed on an outer side surface of the pillar structure 60 instead of being disposed within the pillar structure 60. Thus, it is possible to prevent the resistive memory layer 150 from being exposed in an anisotropic etching process such as a dry etching process in a manufacturing process of the cross-point array device. This will be described later. Typically, since the anisotropic etching process is performed with plasma, the resistive memory layer 150 may be physically damaged during the anisotropic etching process. In this embodiment, it is possible to prevent the resistive memory layer 150 from being exposed in the anisotropic etching process in which the resistive memory layer 150 may be physically damaged. As a result, it is possible to prevent material characteristics of the resistive memory layer 150 from deteriorating.

Meanwhile, referring again to FIGS. 2A and 2B, the pillar structure 60 disposed on the first conductive line 125 may have a predetermined diameter $D_{60}$ in the first direction. The pillar structure 60 may maintain a predetermined spacing $S_{60}$ from its adjacent pillar structures 60 arranged along the first direction, for example, the x-direction. In an embodiment, the diameter $D_{60}$ and the spacing $S_{60}$ may have substantially the same magnitude. The second conduction line 175 may extend in the second direction perpendicular to the first direction, that is, in the y-direction. The second conductive line 175 may have a predetermined width $W_{175}$ in the first direction. In addition, the second conductive line 175 may maintain a predetermined spacing $S_{175}$ from its adjacent second conductive lines 175 arranged along the first direction. In an embodiment, the width $W_{175}$ and the spacing $S_{175}$ may have substantially the same magnitude. At this time, the sum of the width $W_{175}$ and the spacing $S_{175}$ may be referred to as a pitch $W_P$ of the second conductive line 175. In an embodiment, the magnitude of the width $W_{175}$ and spacing $S_{175}$ of the second conducting line 175 may be substantially the same as the magnitude of the diameter $D_{60}$ and spacing $S_{60}$ of the pillar structure 60.

Referring to FIGS. 2A and 2B, the second conductive line 175 may be disposed to be shifted from an edge of the pillar structure 60 in the first direction, that is, the x-direction. The shift amount of the second conductive line 175 from the edge of the pillar structure 60 may be equal to or less than ¼ of the pitch $W_P$ of the second conductive line 175. FIG. 2A illustrates a structure in which the shift amount of the second conductive line 175 is around ¼ of the pitch $W_P$. That is, when viewed in a plan view, a first edge of the second conductive line 175 may pass through centers of the pillar structures 60 arranged along the second direction, and a second edge of the second conductive line 175 may pass through a central line of a spacing, which extends in the second direction and is disposed between two adjacent pillar structures 60 arranged in the first direction. The first edge of the second conductive line 175 is at an opposite side to the second edge in the first direction with respect to the second conductive line 175.

When the shift amount of the second conductive line 175 exceeds ¼ of the pitch $W_P$ of the second conductive line 175, an unintended device operation may occur due to a voltage applied to the second conductive line 175 not only in a memory cell of a pillar structure 60 with which the second conductive line 175 is directly in contact but also in a memory cell of an adjacent pillar structure 60 with which the conductive line 175 is not in contact. For example, if the shift amount of the second conductive line 175 exceeds ¼ of the pitch $W_P$ of the second conductive line 175, when the read voltage or the first or second write voltage is applied between the first and second conductive lines 125 and 175 connected to a certain pillar structure 60, a threshold switching layer 160 corresponding to an adjacent pillar structure 60, which is not in contact with the second conductive line 175, may be turned on. The threshold switching layer 160 corresponding to the adjacent pillar structure 60 may be turned on because, when the second conductive line 175 is excessively close to the adjacent pillar structure 60, the spacing between the second conductive line 175 and a memory electrode layer 135 of the adjacent pillar structure 60 is reduced, and thus an electric field applied to the threshold switching layer 160 corresponding to the adjacent pillar structure 60 may reach a threshold electric field that causes a switching operation in the threshold switching layer 160 corresponding to the adjacent pillar structure 60.

In addition, the read voltage or the first or second write voltage may change a resistance state of a resistive memory layer 150 corresponding to the adjacent pillar structure 60 as well as turning on the threshold switching layer 160 corresponding to the adjacent pillar structure 60. Accordingly, to prevent the reliability of the memory operation of the cross-point array device from deteriorating, the second conductive line 175 should be positioned so that the shift amount of the second conductive line 175 is less than or equal to ¼ of the pitch $W_P$ from an edge of the certain pillar structure 60 that is in contact with the second conductive line 175.

In the above description in connection with FIGS. 2A and 2B, the width $W_{175}$ and the spacing $S_{175}$ of the second conduction line 175 have the same magnitude, and the diameter $D_{60}$ and the width $W_{60}$ of the pillar structure 60 have the same magnitude, but the present disclosure is not necessarily limited thereto. In other embodiments, the width $W_{175}$ and the spacing $S_{175}$ of the second conduction line 175 may be different from each other, and the diameter $D_{60}$ and the spacing $S_{60}$ of the pillar structure 60 may also be different from each other. Accordingly, the shift amount of the second conductive line 175 may not necessarily be limited to ¼ or less of the pitch $W_P$ of the second conductive line 175. That is, as long as the second conductive line 175 is shifted and at least a part of the second conductive line 175 contacts a side surface of the corresponding certain pillar structure 60 without affecting a memory operation of a pillar structure 60 adjacent to the certain pillar structure 60, the shift amount of the second conductive line 175 may be variously modified.

Figure 3:
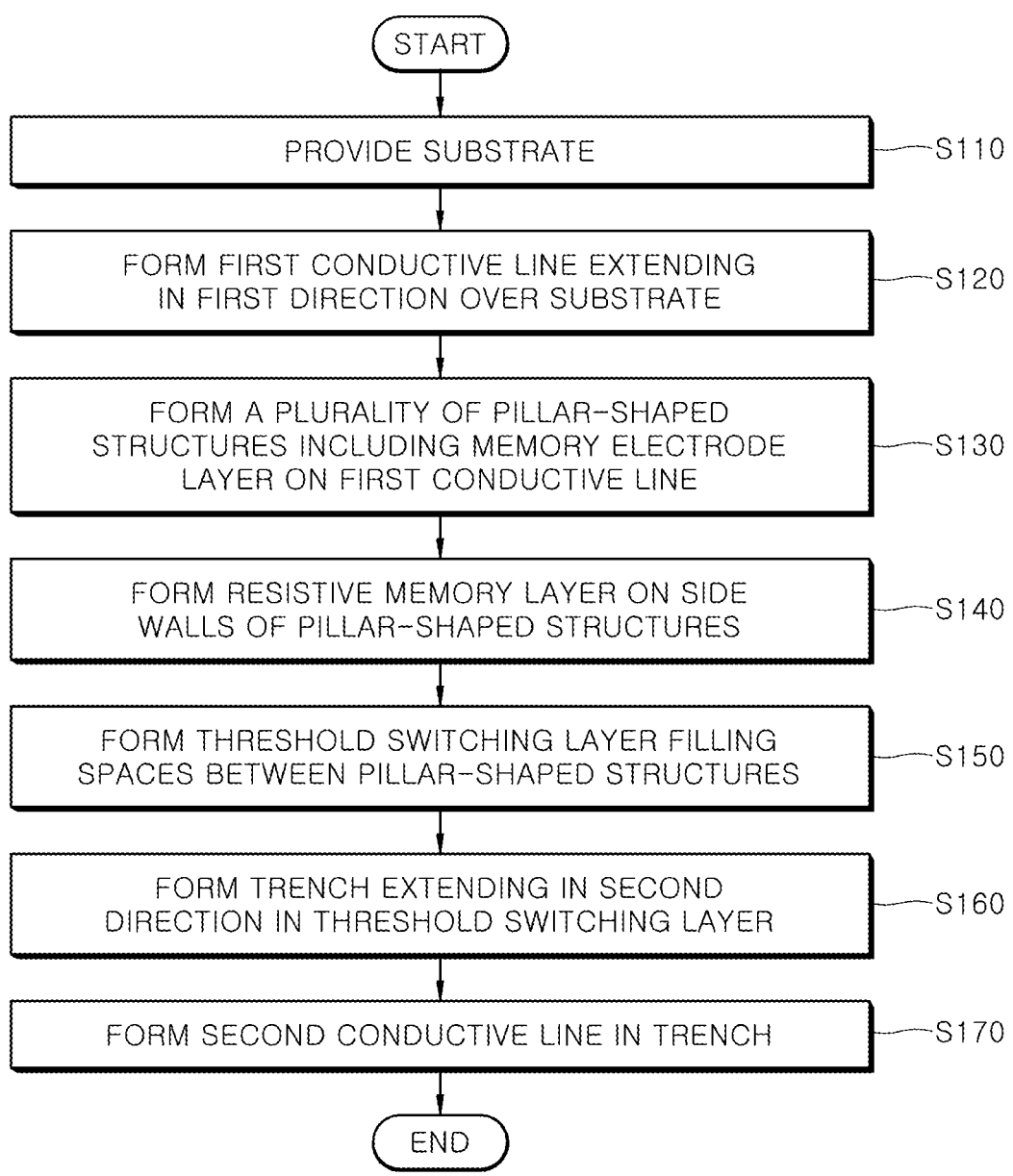
FIG. 3 is a flow chart schematically illustrating a method of manufacturing a cross-point array device according to an embodiment of the present disclosure.

FIG. 3 is a flow chart schematically illustrating a method of manufacturing a cross-point array device according to an embodiment of the present disclosure. Referring to FIG. 3, in step S110, a substrate may be provided. The substrate may include a semiconductor material. In step S120, a first conductive line extending in a first direction may be formed on the substrate. The first conductive line may include a metal, a conductive metal nitride, or a conductive metal oxide. In step S130, a plurality of pillar structures including memory electrode layers may be formed on the first conductive line. The memory electrode layer may include tantalum, hafnium, titanium, or a combination thereof. In step S140, a resistive memory layer may be formed on a side surface of each of the pillar structures. In a specific embodiment, the resistive memory layer may be formed on a side surface of the memory electrode layer along surfaces of the pillar structures. The resistive memory layer may include a metal oxide. The metal oxide may include a titanium oxide, an aluminum oxide, a nickel oxide, a copper oxide, a zirconium oxide, a manganese oxide, a hafnium oxide, a tungsten oxide, a tantalum oxide, a niobium oxide, an iron oxide, or a combination thereof. The metal oxide may include oxygen vacancies. In step S150, a threshold switching layer filling spaces between the pillar structures is formed on the resistive memory layer. In an embodiment, the threshold switching layer may be formed to cover the pillar structures. The threshold switching layer may include a metal oxide, a metal nitride, a chalcogenide-based material, or a combination thereof.

In step S160, trenches extending in a second direction may be formed in the threshold switching layer. The trenches may partially expose side surfaces of the pillar structures. However, a memory electrode layer of each of the pillar structures may not be exposed by a corresponding trench. In step S170, a second conductive line may be formed in a corresponding one of the trenches. The second conductive line may include a metal, a conductive metal nitride, or a conductive metal oxide.

Through the above-described method, the cross-point array device according to an embodiment of the present disclosure can be manufactured. The cross-point array device may include the resistive memory layer and the threshold switching layer that are connected in series to each other between the first and second conductive lines.

FIGS. 4A, 5A, 6A, 7A, 8A, and 9A are plan views schematically illustrating a method of manufacturing a cross-point array device according to an embodiment of the present disclosure. FIGS. 4B, 5B, 6B, 7B, 8B, and 9B are cross-sectional views taken along line I-I' of FIGS. 4A, 5A, 6A, 7A, 8A, and 9A, respectively. FIGS. 4C, 5C, 6C, 7C, 8C, and 9C are cross-sectional views taken along line II-II' of FIGS. 4A, 5A, 6A, 7A, 8A, and 9A, respectively.

Figure 4A:
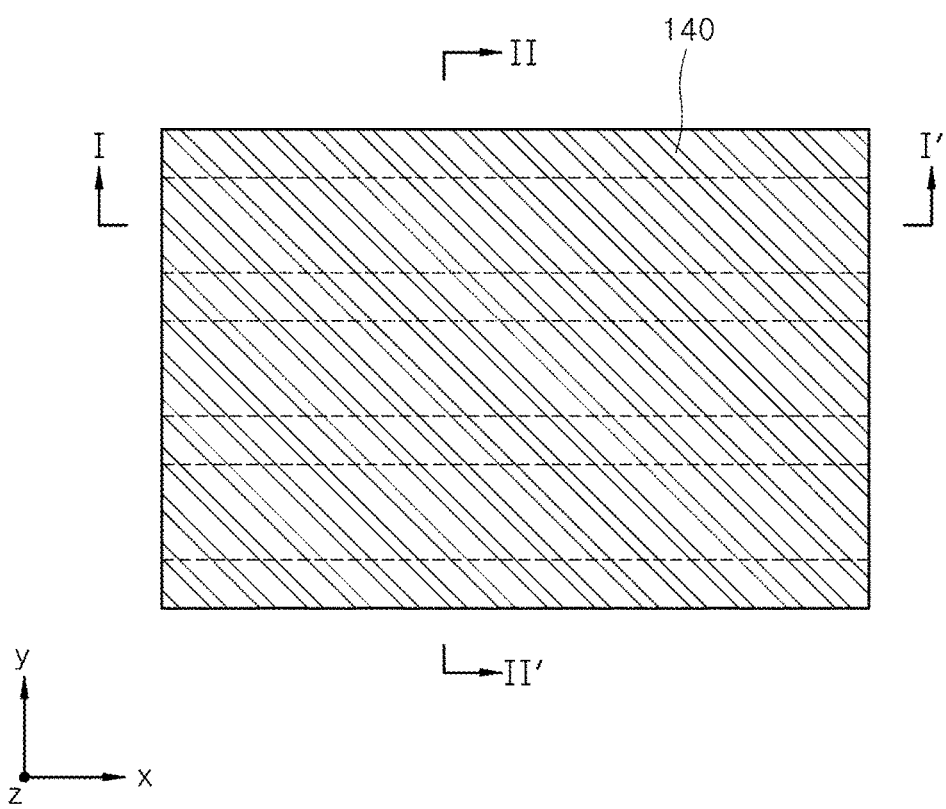
FIGS. 4A, 5A, 6A, 7A, 8A, and 9A are plan views schematically illustrating a method of manufacturing a cross-point array device according to an embodiment of the present disclosure.
Figure 4B:
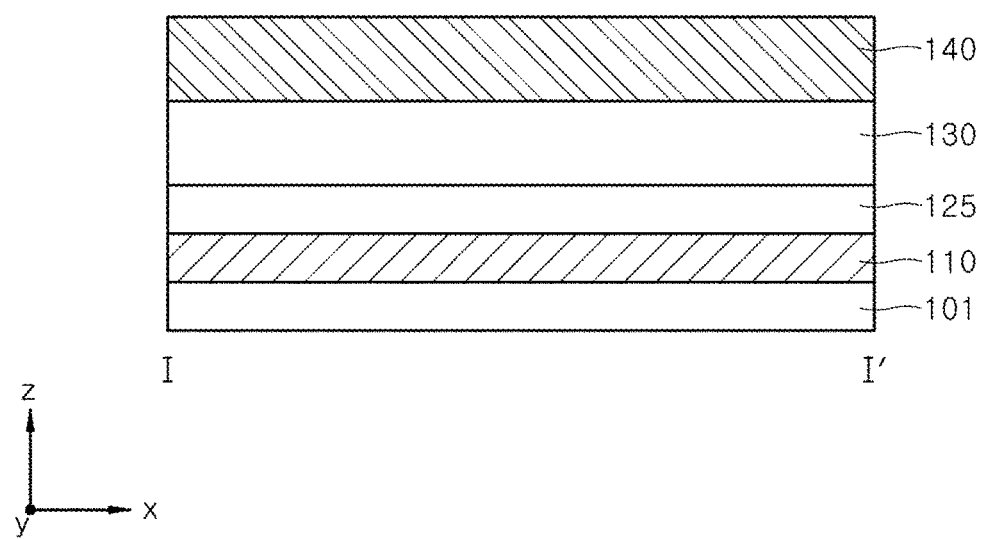
FIGS. 4B, 5B, 6B, 7B, 8B, and 9B are cross-sectional views taken along line I-I' of FIGS. 4A, 5A, 6A, 7A, 8A, and 9A, respectively.
Figure 4C:
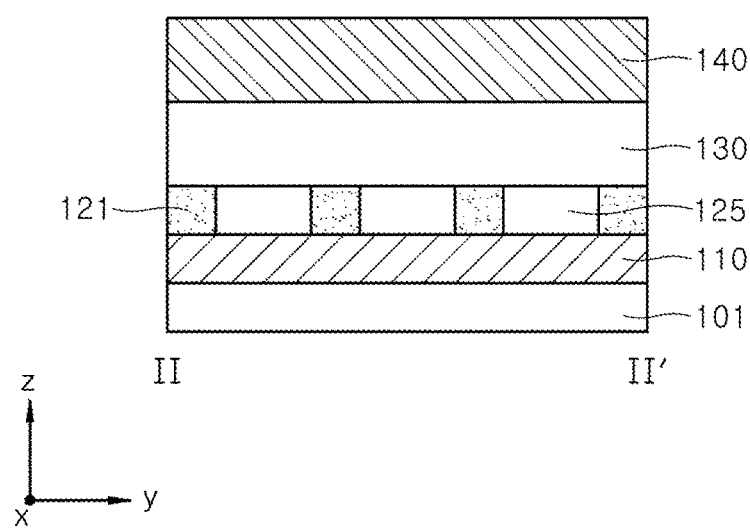
FIGS. 4C, 5C, 6C, 7C, 8C, and 9C are cross-sectional views taken along line II-II' of FIGS. 4A, 5A, 6A, 7A, 8A, and 9A, respectively.

Referring to FIGS. 4A, 4B, and 4C, a substrate 101 may be provided. The substrate 101 may be a silicon (Si) substrate, a gallium arsenide (GaAs) substrate, an indium phosphide (InP) substrate, a germanium (Ge) substrate, a silicon germanium (SiGe) substrate, or a silicon-on-insulator (SOI) substrate. The substrate 101 may be a n-type doped substrate or a p-type doped substrate. The substrate 101 may be a p-type doped silicon substrate. In some other embodiments, the substrate 101 may be an insulating substrate or a conductive substrate. The conductive substrate may be a metal substrate or a conductive oxide substrate.

A first insulating layer 110 may be formed on the substrate 101. The first insulating layer 110 may include a silicon oxide, a silicon nitride, or a silicon oxynitride. The first insulating layer 110 may insulate the substrate 101 from a conductive material formed over the substrate 101. The first insulating layer 110 may be formed using a chemical vapor deposition method, a physical vapor deposition method, a coating method, or the like. In an embodiment, when the substrate 101 is an insulating substrate, the first insulating layer 110 may be omitted. Although not illustrated, at least one layer or wiring may be formed between the substrate 101 and the first insulating layer 110. Alternatively, vias may be formed in the first insulating layer 110.

First conductive lines 125 extending in a first direction and a second insulating layer 121 insulating the first conductive lines 125 from each other may be formed on the first insulating layer 110. In an embodiment, the first conductive lines 125 and the second insulating layer 121 may be formed as follows. At first, an insulating layer is formed on the substrate 101. After that, the insulating layer is patterned to form insulating layer patterns extending in the first direction, for example, an x-direction, on the substrate 101. Then, a conductive layer covering the insulating layer patterns and filling spaces between the insulating layer patterns is formed and then the conductive layer is planarized so that the resulting upper surfaces of the conductive layer and the insulating layer patterns are substantially co-planar to each other. As a result, the first conductive line 125 and the second insulating layer 121 may be formed to be alternately arranged in a second direction, for example, a y-direction.

In another embodiment, the first conductive lines 125 may be formed as follows. A conductive film is formed on the substrate 101. Then, the conductive film is patterned to form conductive film patterns extending in the first direction. Next, an insulating layer covering the conductive film patterns and filling spaces between the conductive film patterns is formed and then the insulating layer is planarized so that the resulting upper surfaces of the conductive film patterns and the insulating layer are substantially co-planar to each other. As a result, the first conductive lines 125 and the second insulating layer 121 may be formed. The conductive film may include gold (Au), platinum (Pt), copper (Cu), aluminum (Al), silver (Ag), ruthenium (Ru), titanium (Ti), iridium (Ir), tungsten (W), titanium nitride (TiN), tantalum nitride (TaN), ruthenium oxide ($RuO_2$), or the like. The conductive film may be formed using a chemical vapor deposition method, an atomic layer deposition method, or the like.

Next, an electrode film 130 and a hard mask film 140 may be sequentially formed on the first conductive lines 125 and the second insulating layer 121. The electrode film 130 may include tantalum (Ta), hafnium (Hf), titanium (Ti), or a combination thereof. The electrode film 130 may be a metal layer such as a tantalum (Ta) layer, a hafnium (Hf) layer, or a titanium (Ti) layer. The electrode film 130 may be formed by applying a chemical vapor deposition method, a physical vapor deposition method, or the like. The physical vapor deposition method may include a sputtering method or an atomic layer deposition method. The hard mask film 140 may include an oxide, a nitride, or an oxynitride. For example, the hard mask film 140 may be a silicon nitride layer. The hard mask film 140 may be formed by applying a chemical vapor deposition, a physical vapor deposition method, a coating method, or the like.

Figure 5A:
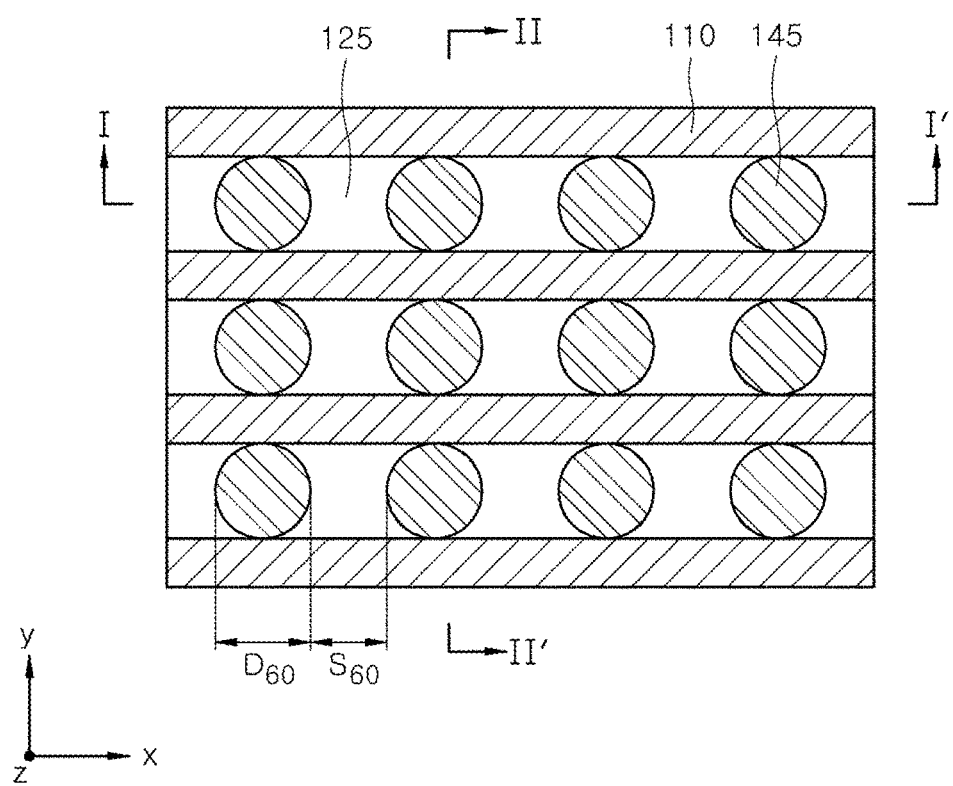
Figure 5B:
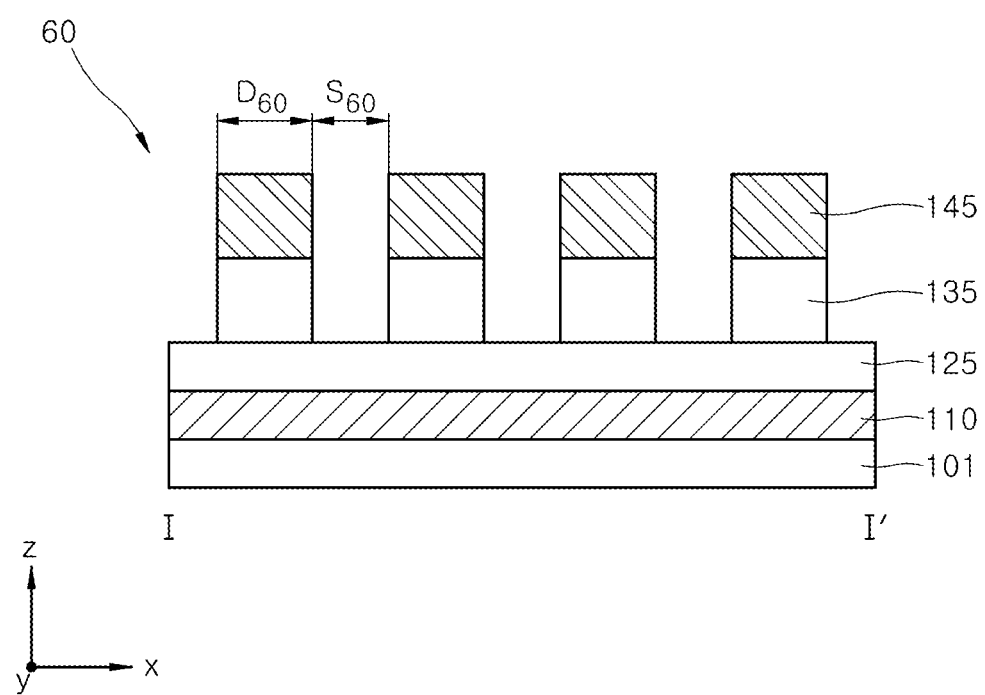
Figure 5C:
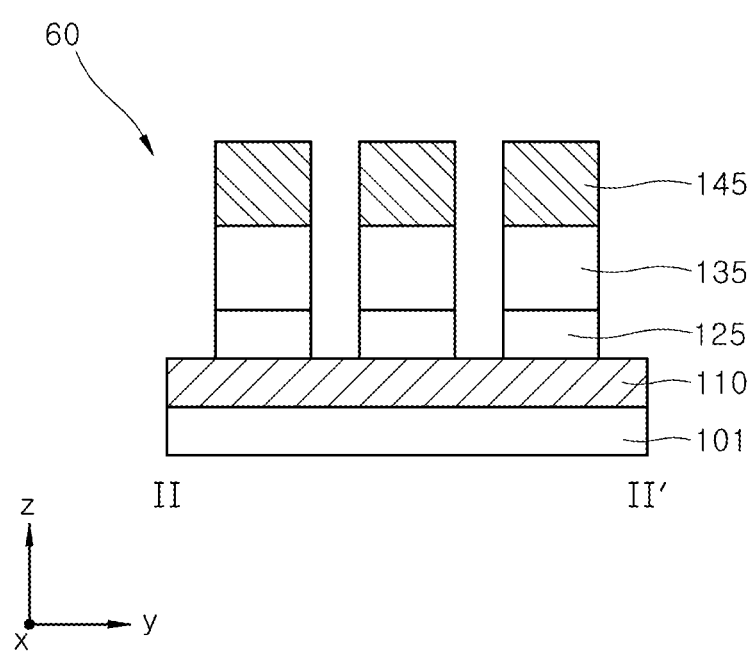

Referring to FIGS. 5A, 5B, and 5C, the hard mask film 140 and the electrode film 130 may be sequentially patterned to form a plurality of pillar structures 60 on the first conductive lines 125. The pillar structure 60 may include a memory electrode layer 135 and a hard mask layer 145. The memory electrode layer 135 may be electrically connected to the first conductive line 125. In a process of forming the plurality of pillar structures 60, the second insulating layer 121 on the first insulating layer 110 may be removed. In an embodiment, the pillar structure 60 may have a predetermined diameter $D_{60}$. In addition, the pillar structure 60 may be spaced apart from adjacent pillar structures 60 in the first direction, that is, the x-direction, by a predetermined spacing $S_{60}$. In an embodiment, the diameter $D_{60}$ and the spacing $S_{60}$ may have substantially the same magnitude.

Figure 6A:
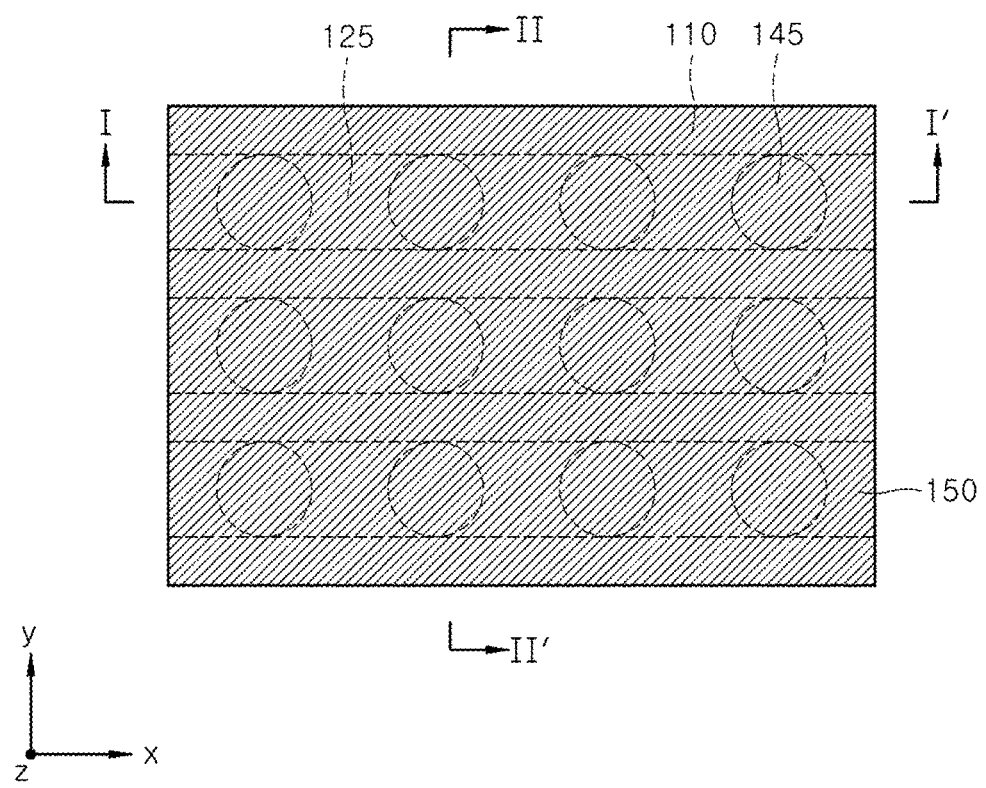
Figure 6B:
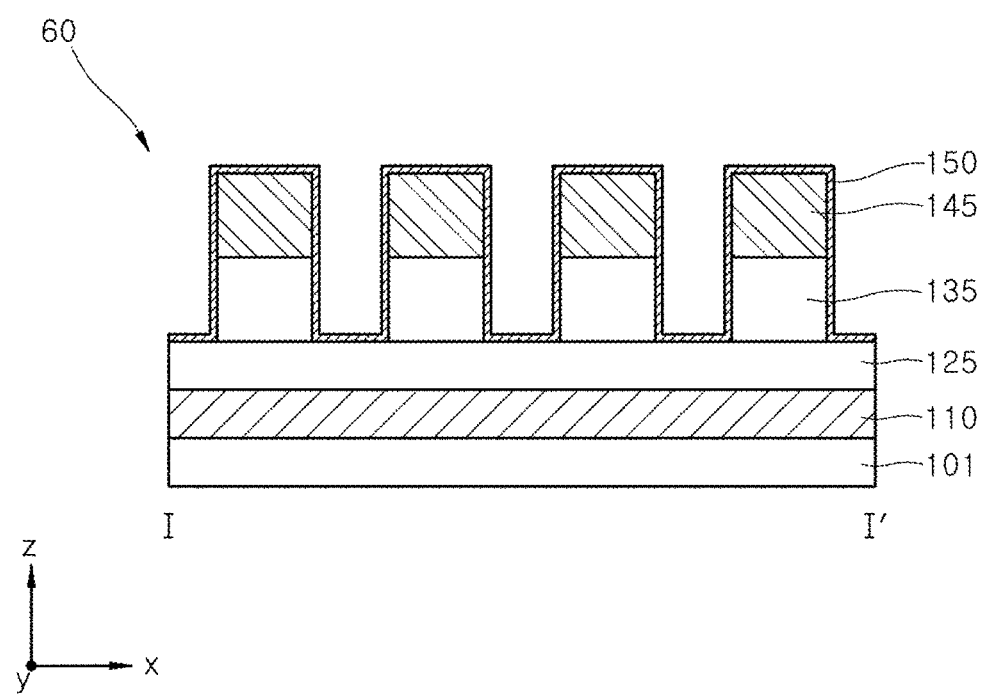
Figure 6C:
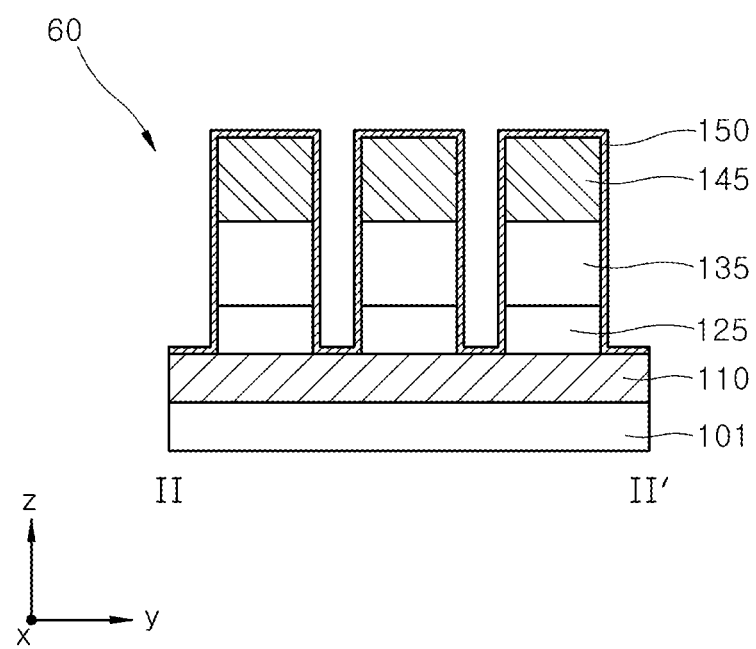

Referring to FIGS. 6A, 6B, and 6C, a resistive memory layer 150 may be formed on the plurality of pillar structures 60 over the substrate 101. The resistive memory layer 150 may be formed by forming a variable resistance film along a profile of a resultant structure including the plurality of pillar structures 60. That is, the resistive memory layer 150 may cover all surfaces exposed as a result of forming the plurality of pillar structures 60. Therefore, the resistive memory layer 150 may be formed at least on upper and side surfaces of the plurality of pillar structures 60 each including the memory electrode layer 135 and the hard mask layer 145. In an embodiment, the variable resistance film may include a metal oxide. The metal oxide may include a titanium oxide, an aluminum oxide, a nickel oxide, a copper oxide, a zirconium oxide, a manganese oxide, a hafnium oxide, a tungsten oxide, a tantalum oxide, a niobium oxide, an iron oxide, or the like. In an embodiment, the metal oxide may include oxygen vacancies. That is, when comparing amounts of metal and oxygen that satisfy the stoichiometric ratio with each other, the amount of metal in the metal oxide of this embodiment may be relatively greater than the amount of oxygen.

Referring to FIGS. 6B and 6C, the variable resistance film may be formed on a side surface of the memory electrode layer 135 and on upper and side surfaces of the hard mask layer 145. The variable resistance film may be formed by applying a chemical vapor deposition method or an atomic layer deposition method. The variable resistance film may be formed in a thickness of around 1 nm to around 10 nm, for example.

Figure 7A:
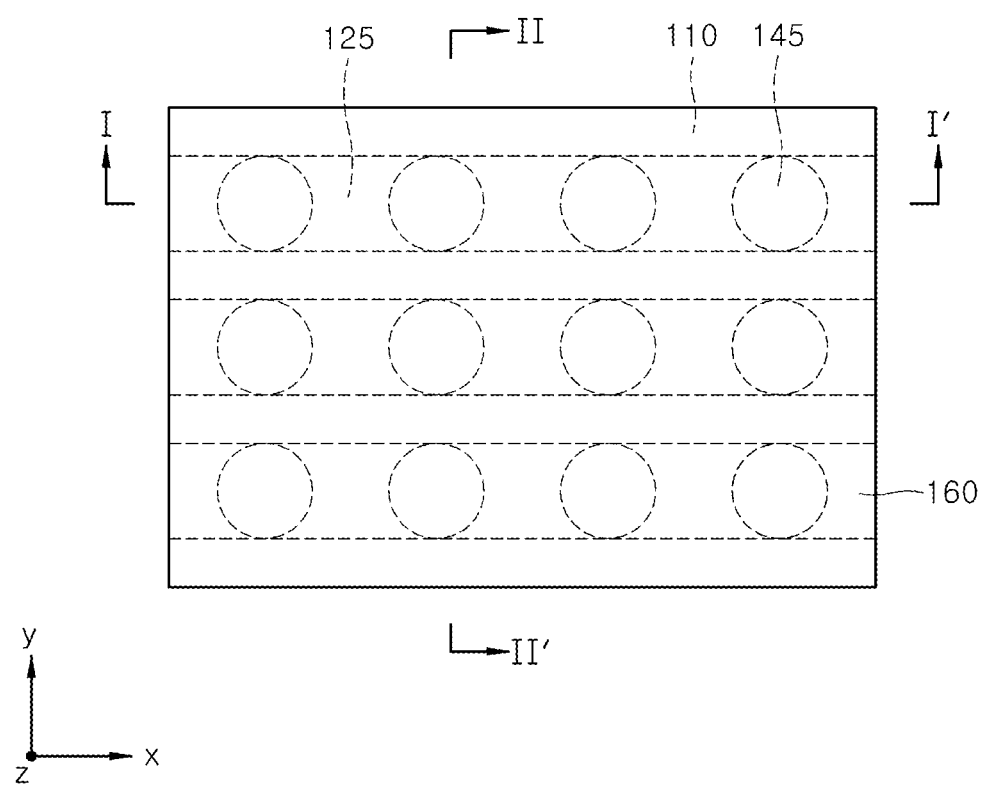
Figure 7B:
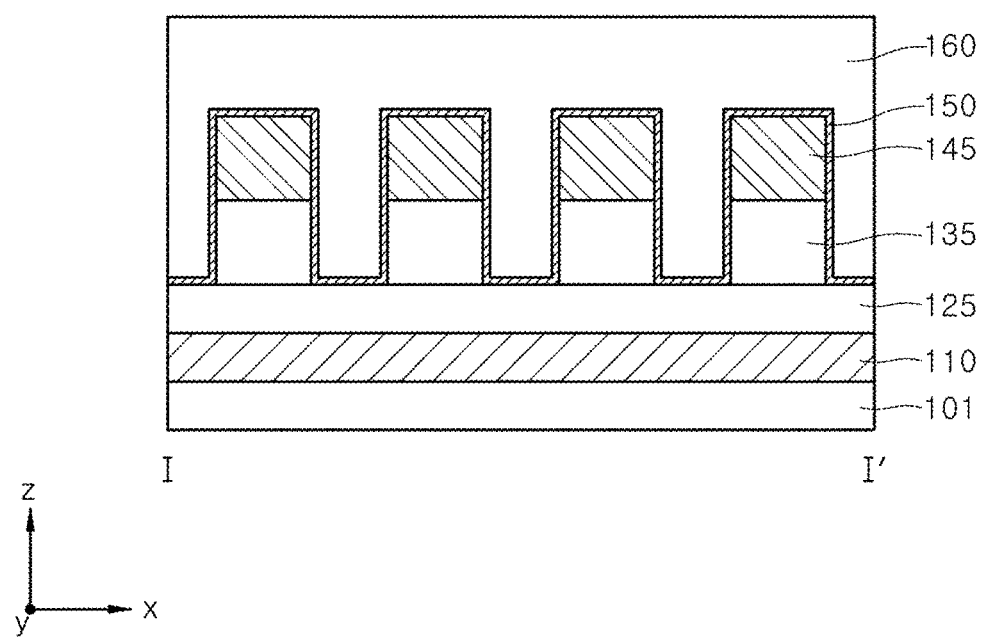
Figure 7C:
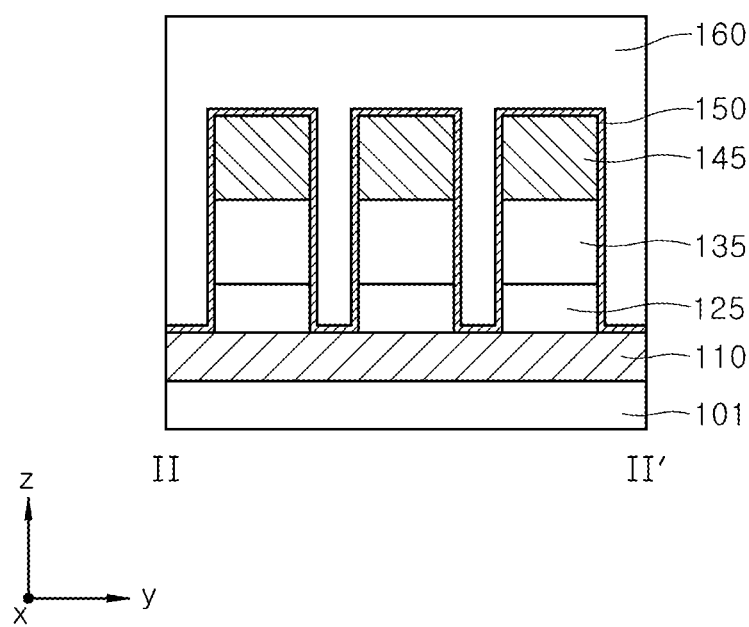

Referring to FIGS. 7A, 7B, and 7C, a threshold switching layer 160 filling spaces between the plurality of pillar structures 60 may be formed. The threshold switching layer 160 may be formed to cover the resistive memory layer 150. In an embodiment, the threshold switching layer 160 may be formed by depositing an insulative switching film over the substrate 101 to fill the spaces between the plurality of pillar structures 60 and to cover the plurality of pillar structures 60 and then planarizing the insulative switching film formed over the substrate 101. As a result of the planarization, the threshold switching layer 160 may be formed to have a predetermined height from the upper surfaces of the plurality of pillar structures 60.

The insulative switching film may include a metal oxide, a metal nitride, a chalcogenide-based material, or a combination thereof. The metal oxide may include a silicon oxide, an aluminum oxide, a zirconium oxide, a hafnium oxide, a tungsten oxide, a titanium oxide, a nickel oxide, a copper oxide, a manganese oxide, a tantalum oxide, a niobium oxide, an iron oxide, or the like. In an embodiment, the metal oxide may include a dopant. The dopant may include boron (B), nitrogen (N), carbon (C), phosphorus (P), aluminum (Al), lanthanum (La), niobium (Nb), vanadium (V), tantalum (Ta), tungsten (W), chromium (Cr), molybdenum (Mo), or a combination thereof. The metal nitride may include a silicon nitride.

The chalcogenide-based material may include a germanium-antimony-tellurium (Ge—Sb—Te)-based material. The germanium-antimony-tellurium (Ge—Sb—Te)-based material may include $Ge_2Sb_2Te_5$, $GeSb_2Te_4$, $GeSb_4Te$, or the like. The chalcogenide-based material may include germanium-tellurium (Ge—Te), indium-selenium (In—Se), antimony-tellurium (Sb—Te), arsenic-tellurium (As—Te), aluminum-tellurium (Al—Te), germanium-antimony-tellurium (Ge—Sb—Te), tellurium-germanium-arsenic (Te—Ge—As), indium-antimony-tellurium (In—Sb—Te), tellurium-tin-selenium (Te—Sn—Se), germanium-selenium-gallium (Ge—Se—Ga), bismuth-selenium-antimony (Bi—Se—Sb), gallium-selenium-tellurium (Ga—Se—Te), tin-antimony-tellurium (Sn—Sb—Te), tellurium-germanium-antimony-sulfur (Te—Ge—Sb—S), tellurium-germanium-tin-oxygen (Te—Ge—Sn—O), tellurium-germanium-tin-gold (Te—Ge—Sn—Au), palladium-tellurium-germanium-tin (Pd—Te—Ge—Sn), indium-selenium-titanium-cobalt (In—Se—Ti—Co), germanium-antimony-tellurium-palladium (Ge—Sb—Te—Pd), germanium-antimony-tellurium-cobalt (Ge—Sb—Te—Co), antimony-tellurium-bismuth-selenium (Sb—Te—Bi—Se), silver-indium-antimony-tellurium (Ag—In—Sb—Te), germanium-antimony-selenium-tellurium (Ge—Sb—Se—Te), germanium-tin-antimony-tellurium (Ge—Sn—Sb—Te), germanium-tellurium-tin-nickel (Ge—Te—Sn—Ni), germanium-tellurium-tin-palladium (Ge—Te—Sn—Pd), germanium-tellurium-tin-platinum (Ge—Te—Sn—Pt), or the like.

The insulative switching film may be formed by applying a chemical vapor deposition method, an atomic layer deposition method, or the like. The insulative switching film may be planarized by applying a chemical mechanical polishing method.

Figure 8A:
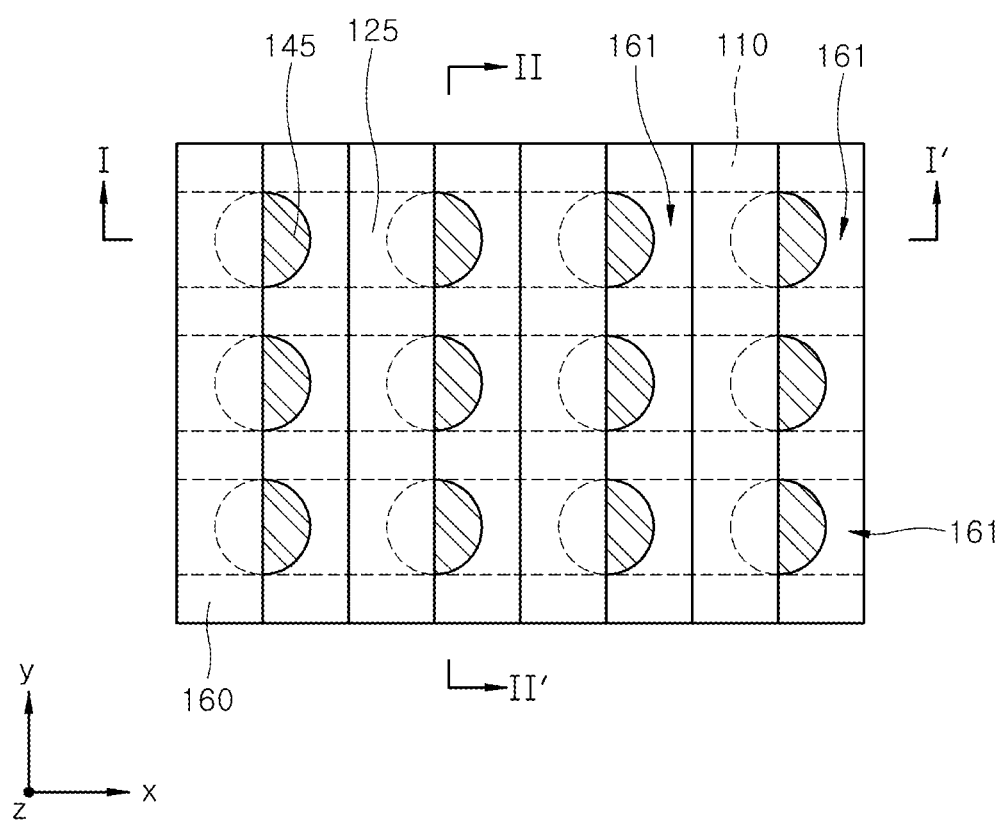
Figure 8B:
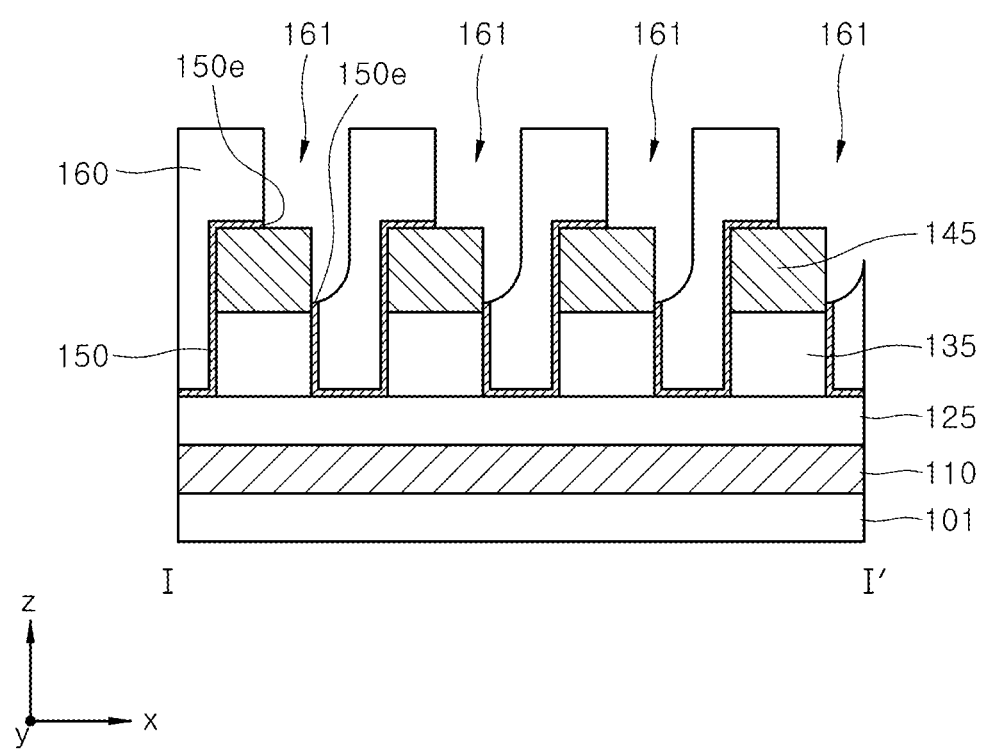
Figure 8C:
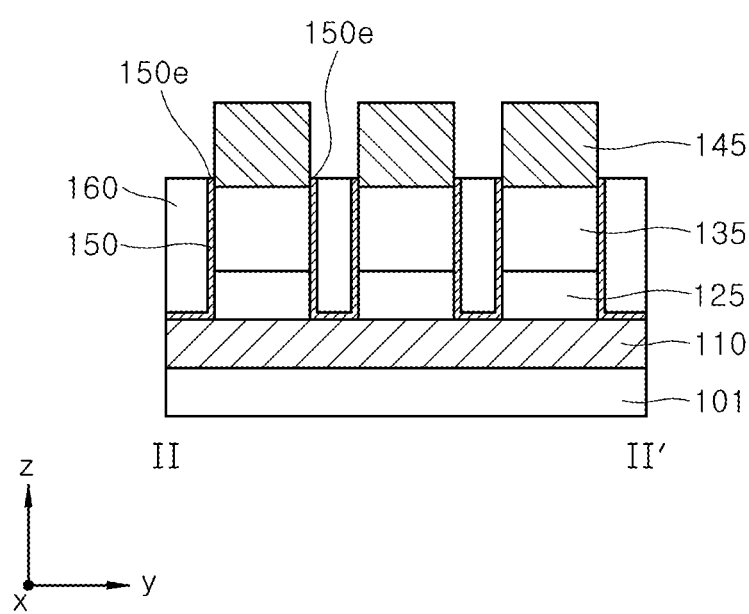

Referring to FIGS. 8A, 8B, and 8C, trenches 161 extending in a second direction may be formed in the threshold switching layer 160. The trenches 161 may be arranged along the first direction. The second direction may be a direction that is not parallel to the first direction. The second direction may be the y-direction. In an embodiment, the trenches 161 may be formed as follows. At first, the threshold switching layer 160 may be selectively etched to partially expose an upper surface and one side surface of the hard mask layer 145 of each pillar structure 160. In order to form the trenches 161, the threshold switching layer 160 may be etched towards the substrate 101 by a predetermined depth in the spacings between the pillar structures 60 arranged in the first direction. The bottom of the trenches 161 in the spacings may be at a higher level than an upper surface of the memory electrode layer 135. Therefore, a side surface of the memory electrode layer 135 may not be exposed by the trench 161.

In the above etch process, a portion of the resistive memory layer 150 that is disposed on the partially exposed upper surface and the exposed one side surface of the hard mask layer 145 may be exposed. In an embodiment, when the threshold switching layer 160 is etched by performing a dry etching process using plasma, the exposed resistive memory layer 150 may be etched. At this time, edge portions 150e of the resistive memory layer 150 are damaged by the dry etching process, and thus electrical properties of the resistive memory layer 150 may be deteriorated. Accordingly, although it is not shown in FIGS. 8A, 8B, and 8C, in some embodiments, the edge portions 150e of the resistive memory layer 150 inside the trench 161 may be subjected to a restoration treatment to cure the damage. The restoration treatment may remedy chemical or physical damages of the resistive memory layer 150 generated by the dry etching process. For example, the restoration treatment may be ozone treatment, oxygen plasma treatment, oxidation heat treatment, or the like.

Figure 9A:
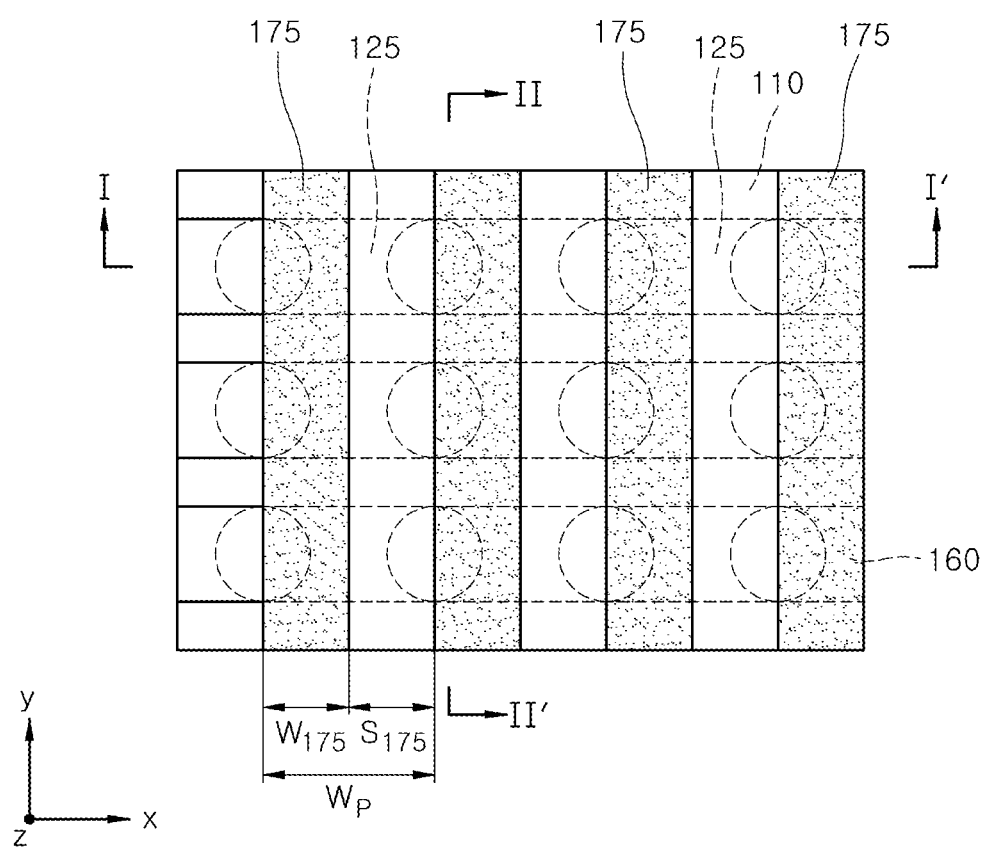
Figure 9B:
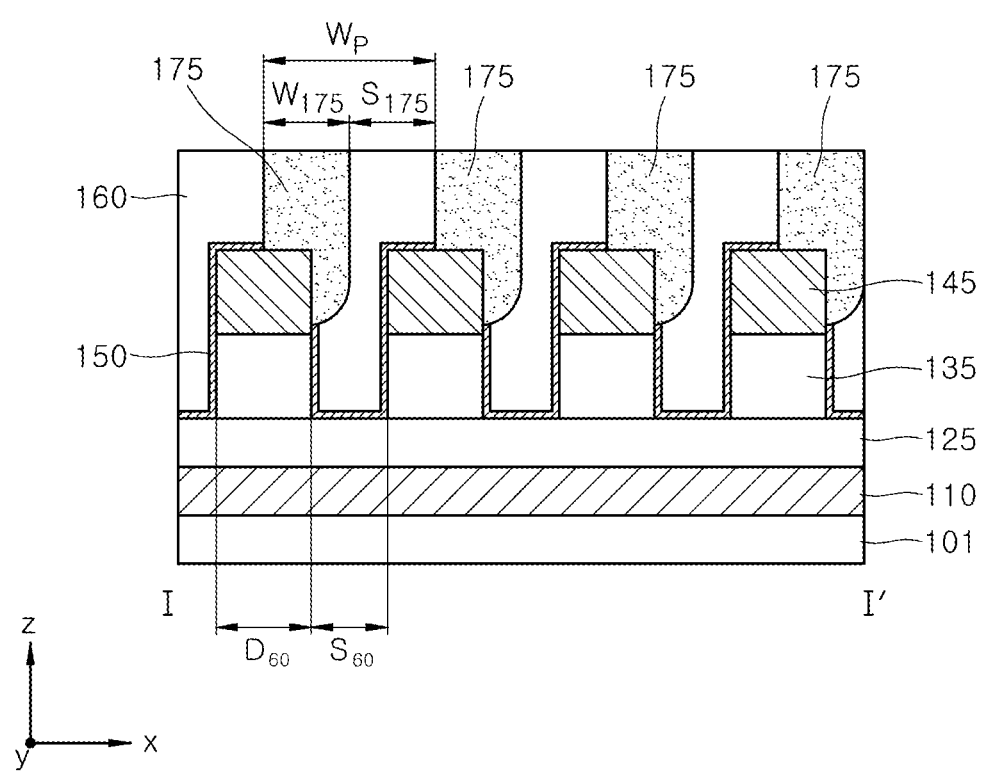
Figure 9C:
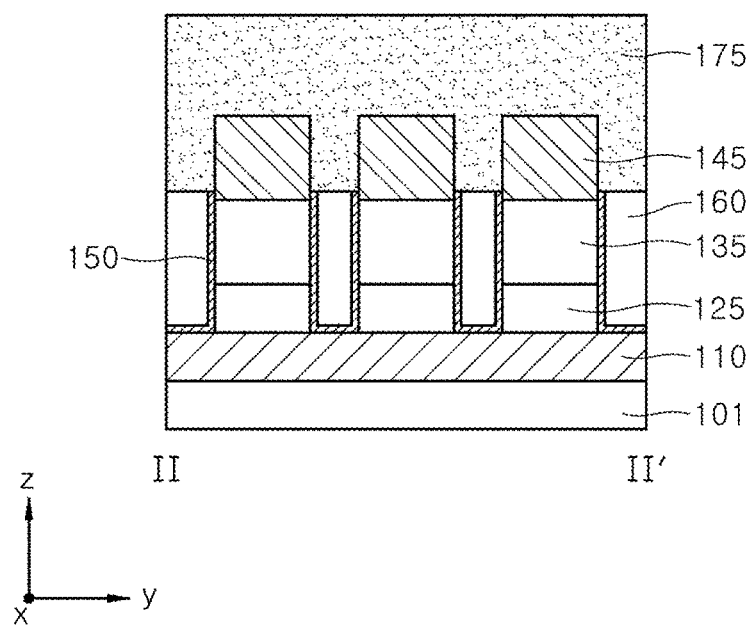

Referring to FIGS. 9A, 9B, and 9C, second conductive lines 175 may be formed in the trenches 161. In an embodiment, the second conductive lines 175 may be formed as follows. At first, a conductive film may be formed to fill the trenches 161 of FIG. 8B and to cover the threshold switching layer 160 remaining after forming the trenches 161. Then, the conductive film may be planarized so that an upper surface of the threshold switching layer 160 and an upper surface of the conductive film are substantially co-planar to each other. The conductive film may include a metal, a conductive metal nitride, or a conductive metal oxide. The conductive film may include gold (Au), platinum (Pt), copper (Cu), aluminum (Al), silver (Ag), ruthenium (Ru), titanium (Ti), iridium (Ir), tungsten (W), titanium nitride (TiN), tantalum nitride (TaN), ruthenium oxide ($RuO_2$), or the like. The conductive film may be formed by applying a chemical vapor deposition method, an atomic layer deposition method, or the like.

The second conductive line 175 may extend in the second direction, that is, the y-direction. The second conductive line 175 may contact the partially exposed upper surface and the exposed one side surface of the hard mask layer 145 inside the trench 161. The second conductive line 175 may contact the threshold switching layer 160. At this time, the second conductive line 175 may be electrically insulated from the memory electrode layer 135.

By proceeding the above-described processes, the cross-point array device according to an embodiment of the present disclosure can be manufactured. Referring again to FIGS. 9A and 9B, the second conductive line 175 may be disposed to be shifted along the first direction, that is, the x-direction, from an edge of the pillar structure 60, rather than being aligned with the pillar structure 60 in a third direction, that is, a z-direction. In an embodiment, the shift amount of the second conductive line 175 may be equal to or less than ¼ of the pitch Wp of the second conductive line 175. For example, in FIGS. 9A and 9B, the shift amount of the second conductive line 175 may be ¼ of the pitch Wp. In other words, along the x-direction, the second conduction line 175 may be disposed such that one end of the second conductive line 175 in the first direction passes through the center of the diameter of each of pillar structures 60 arranged in the second direction and the other end of the second conductive line 175 in the first direction passes through a central line of a spacing, which extends in the second direction and is disposed between a certain pillar structure 60 corresponding to the second conductive line 175 and a pillar structure 60 adjacent to the certain pillar structure 60 in the first direction.

Figure 10A:
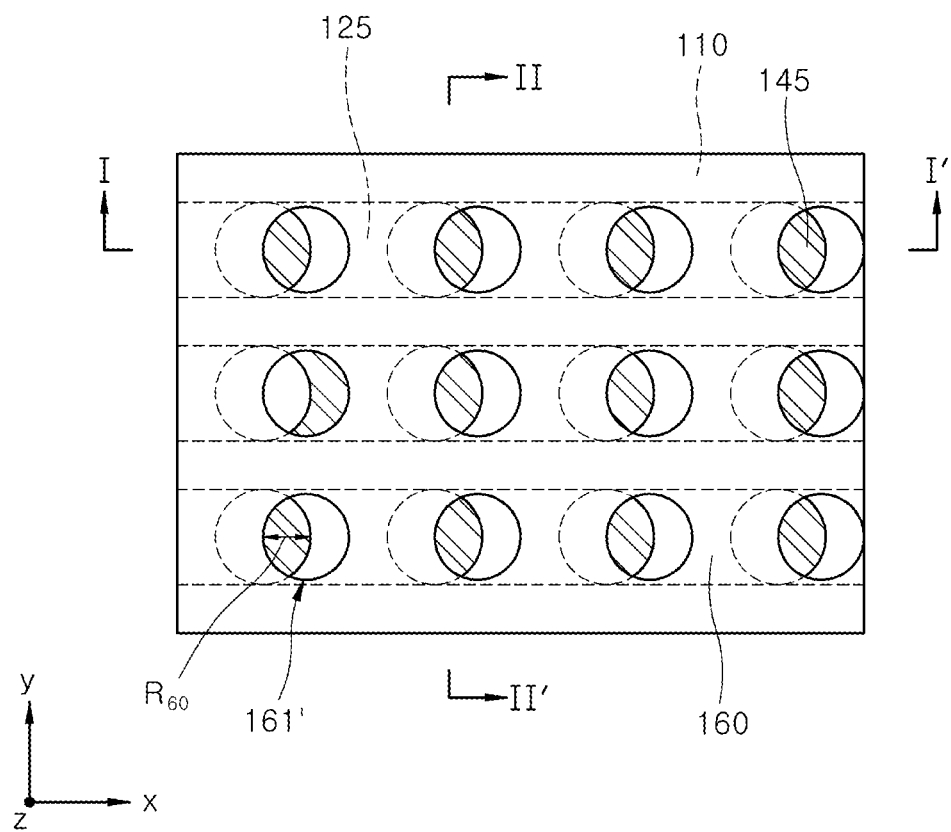
FIGS. 10A, 11A, and 12A are plan views schematically illustrating a method of manufacturing a cross-point array device according to another embodiment of the present disclosure.
Figure 10B:
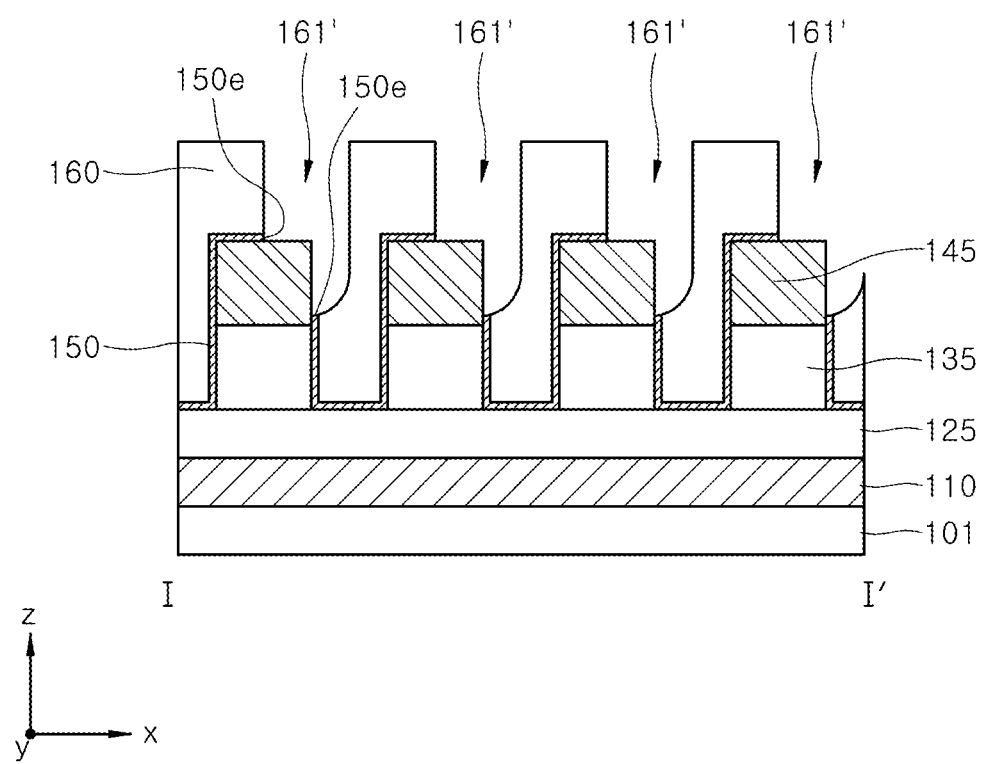
FIGS. 10B, 11B, and 12B are cross-sectional views taken along line I-I' of FIGS. 10A, 11A, and 12A, respectively.
Figure 10C:
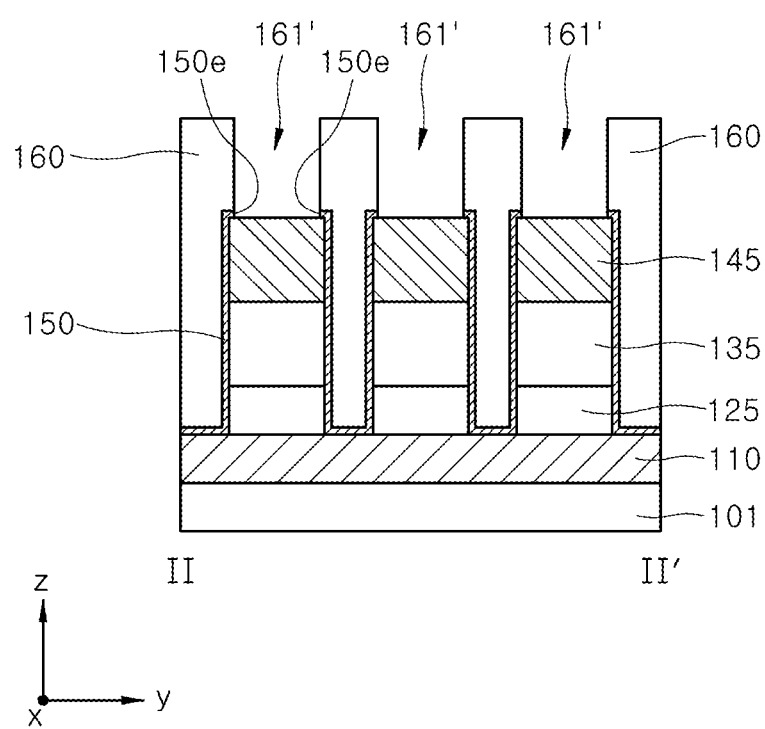
FIGS. 10C, 11C, and 12C are cross-sectional views taken along line II-II' of FIGS. 10A, 11A, and 12A, respectively.
Figure 11A:
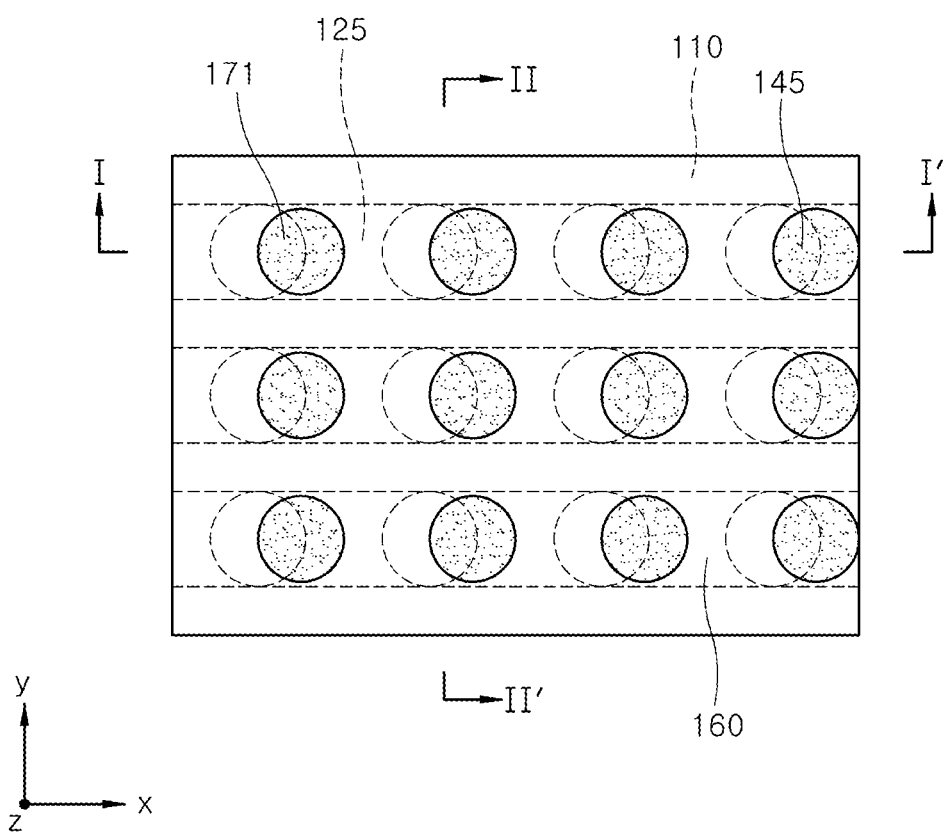
Figure 11B:
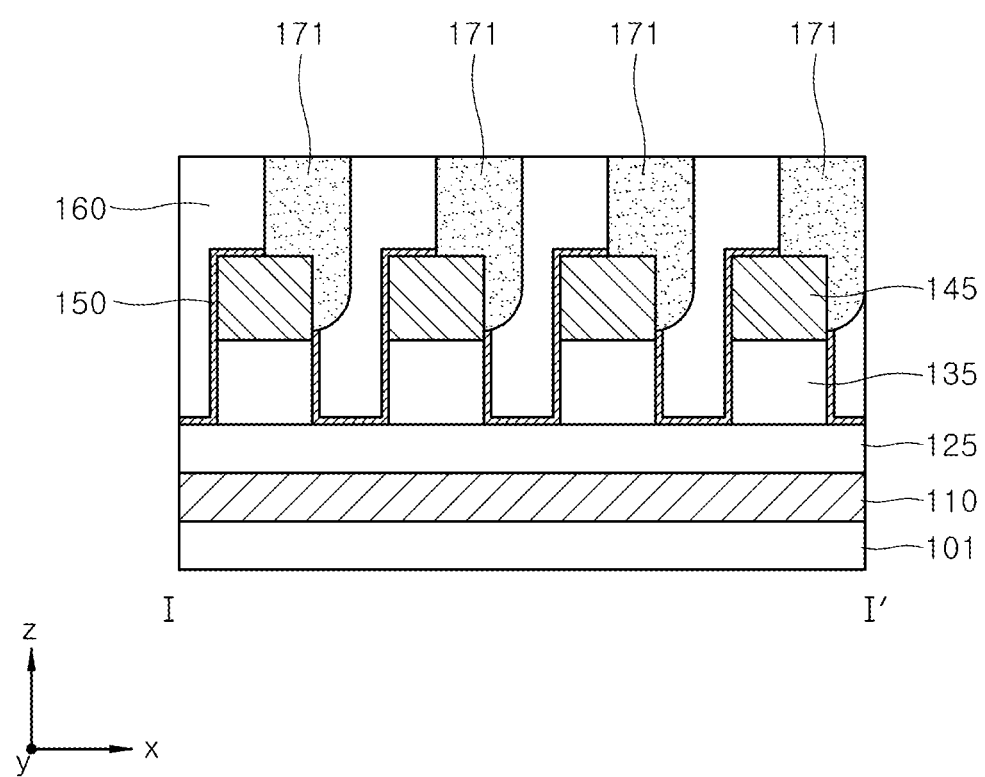
Figure 11C:
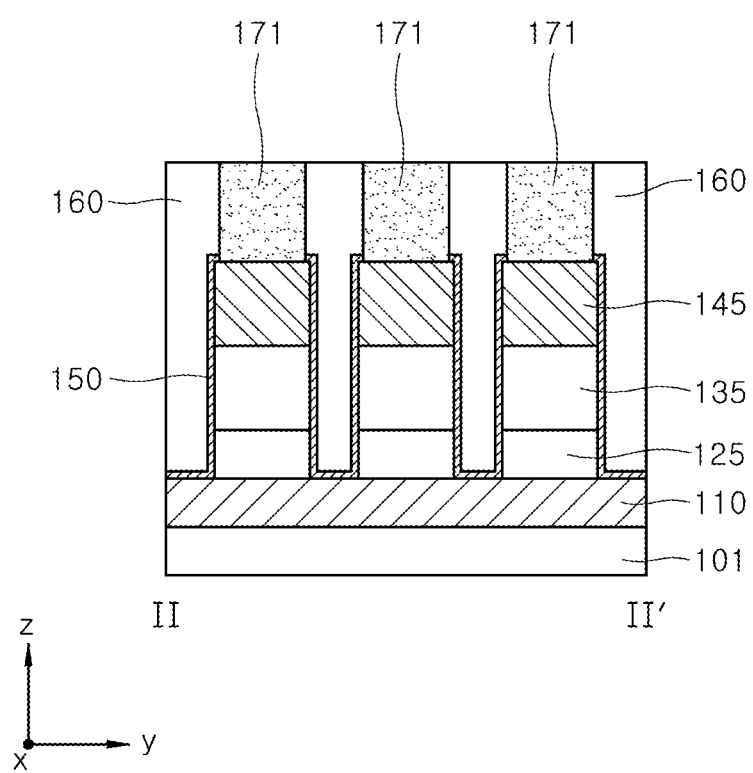
Figure 12A:
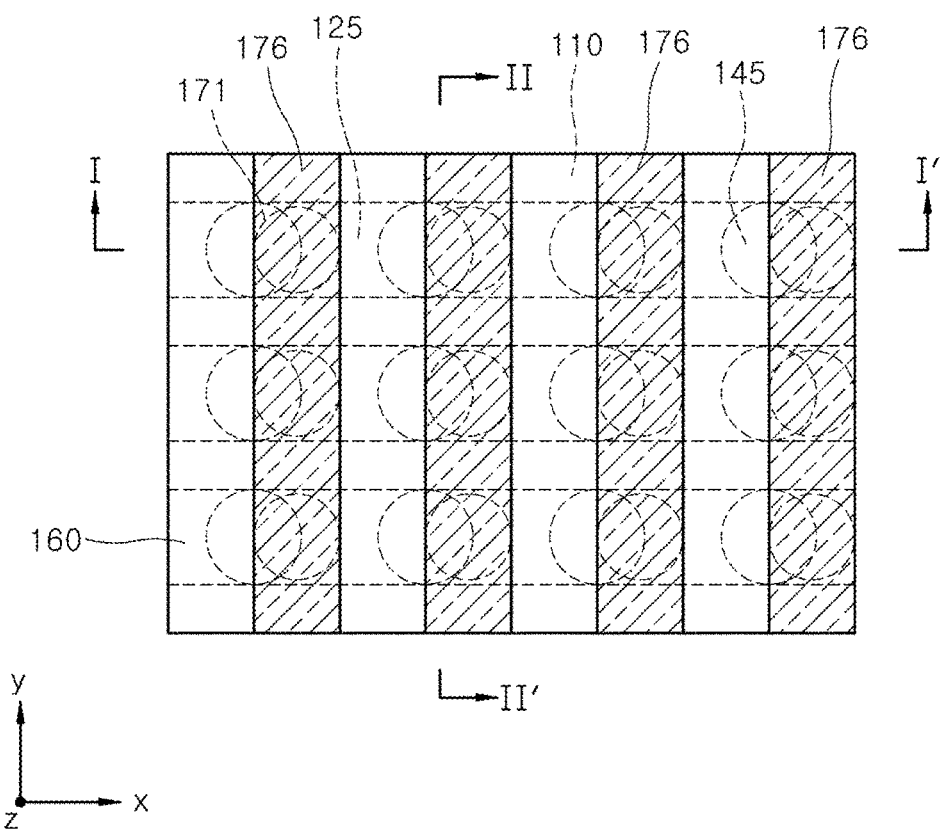
Figure 12B:
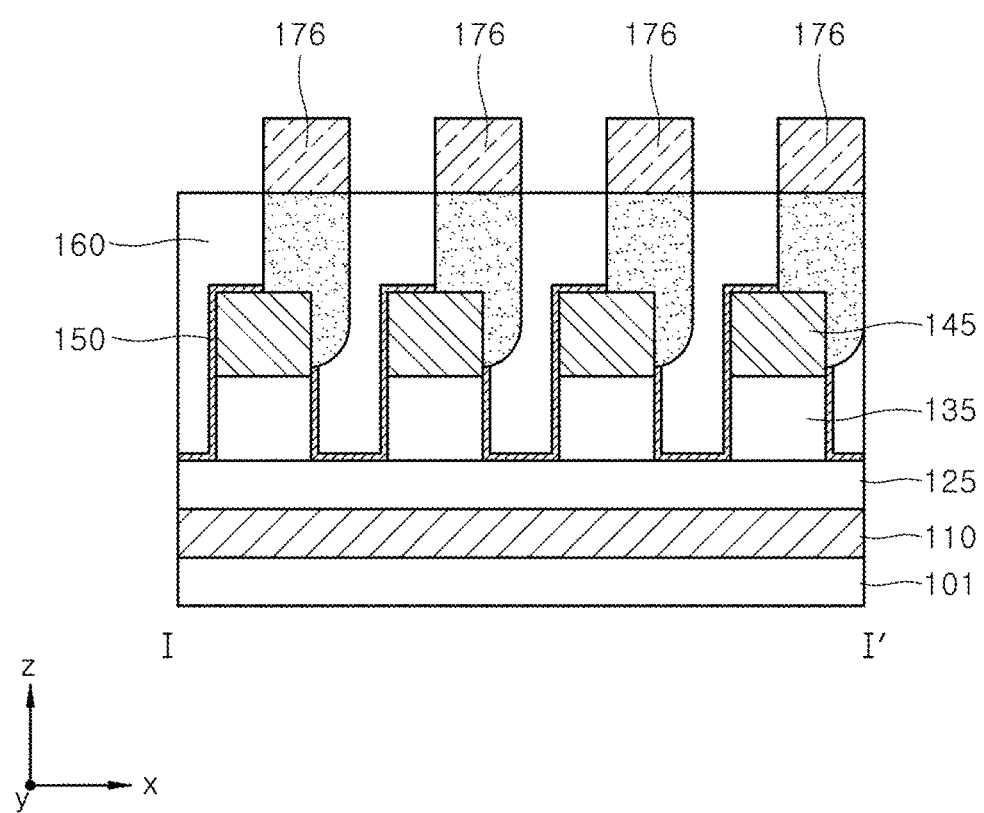
Figure 12C:
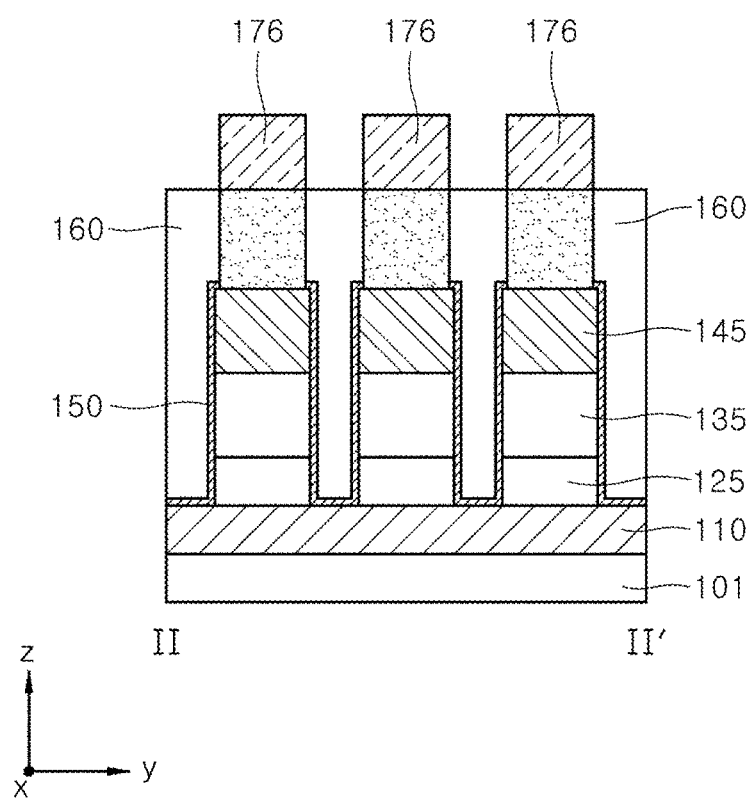

FIGS. 10A, 11A, and 12A are plan views schematically illustrating a method of manufacturing a cross-point array device according to another embodiment of the present disclosure. FIGS. 10B, 11B, and 12B are cross-sectional views taken along line I-I' of FIGS. 10A, 11A, and 12A, respectively. FIGS. 10C, 11C, and 12C are cross-sectional views taken along line II-II' of FIGS. 10A, 11A, and 12A, respectively.

At first, pillar structures 60, a resistive memory layer 150, and a threshold switching layer 160 may be formed over a substrate 101 by performing the processes described above with reference to FIGS. 4A to 7C. Then, referring to FIGS. 10A, 10B, and 10C, contact holes 161' partially exposing upper surfaces and side surfaces of the pillar structures 60 may be formed in the threshold switching layer 160. In an embodiment, the contact holes 161' may be formed by selectively etching the threshold switching layer 160 to partially expose upper surfaces and side surfaces of the hard mask layers 145. At this time, a portion of the resistive memory layer 150 formed on the side surfaces of the pillar structures 60 may be exposed. When the threshold switching layer 160 is etched by performing a dry etching process using plasma, the exposed resistive memory layer 150 may be etched. At this time, edge portions 150e of the resistive memory layer 150 are damaged by the dry etch process and thus electrical properties of the resistive memory layer 150 may be degraded. Accordingly, although it is not shown in FIGS. 10A, 10B, and 10C, in some embodiments, a restoration treatment may be further performed on the edge portions 150e of the resistive memory layer 150 inside the contact holes 161' in order to cure the damage. For example, the restoration treatment may be ozone treatment, plasma treatment, or the like. In an embodiment, an inner radius of the contact hole 161' may be substantially the same as the radius $R_{60}$ of the pillar structure 60. Thus, the contact hole 161' may have substantially the same shape as the pillar structure 60 when viewed in a plan view. In an embodiment, the contact hole 161' may be disposed at a position shifted from the pillar structure 60 by the radius $R_{60}$ of the pillar structure 60 in a first direction, that is, an x-direction.

Referring to FIGS. 11A, 11B, and 11C, conductive contact layers 171 filling the contact holes 161' may be formed. In an embodiment, the conductive contact layers 171 may be formed as follows. At first, a conductive film may be formed to fill the contact holes 161' of FIG. 10B and to cover the threshold switching layer 160. Next, the conductive film may be planarized so that an upper surface of the threshold switching layer 160 and an upper surface of the conductive film are substantially co-planar to each other. The conductive film may include a metal, a conductive metal nitride, or a conductive metal oxide. The conductive film may include gold (Au), platinum (Pt), copper (Cu), aluminum (Al), silver (Ag), ruthenium (Ru), titanium (Ti), iridium (Ir), tungsten (W), titanium nitride (TiN), tantalum nitride (TaN), ruthenium oxide ($RuO_2$), or the like. The conductive film may be formed by performing a chemical vapor deposition method, an atomic layer deposition method, or the like.

Referring to FIGS. 12A, 12B, and 12C, second conductive lines 176 electrically connected to the conductive contact layers 171 and extending in a second direction that is not parallel to the first direction may be formed. The second conductive lines 176 may be formed as follows. At first, a conductive film may be formed on the threshold switching layer 160 and the conductive contact layers 171. Then, the conductive film may be patterned to form the second conductive lines 176 extending in the second direction. The conductive film may include a metal, a conductive metal nitride, or a conductive metal oxide. The conductive film may include gold (Au), platinum (Pt), copper (Cu), aluminum (Al), silver (Ag), ruthenium (Ru), titanium (Ti), iridium (Ir), tungsten (W), titanium nitride (TiN), tantalum nitride (TaN), ruthenium oxide (RuO2), or the like. The conductive film may be formed by applying a chemical vapor deposition method, an atomic layer deposition method, or the like. By proceeding the above-described processes, the cross-point array device according to the other embodiment of the present disclosure can be manufactured.

As described above, according to various embodiments of the present disclosure, in a cross-point array device, a pillar structure including a memory electrode layer is formed, and then a resistive memory layer is formed on a side surface of the pillar structure. Thus, it is possible to suppress the resistive memory layer from being damaged by an etching process using plasma or the like, which is performed to form the pillar structure. As a result, it is possible to prevent electrical characteristics of the resistive memory layer from being deteriorated by the etching damage, thereby improving the reliability of an operation of the cross-point array device.

The embodiments of the inventive concept have been disclosed above for illustrative purposes. Those of ordinary skill in the art will appreciate that various modifications, additions, and substitutions are possible, without departing from the scope and spirit of the inventive concept as disclosed in the accompanying claims.

What is claimed is:

1. A cross-point array device comprising:
a substrate;
a first conductive line disposed over the substrate and extending in a first direction;
a plurality of pillar structures disposed on the first conductive line, each of the plurality of pillar structures comprising a memory electrode layer;
a resistive memory layer disposed on outer surfaces of the plurality of pillar structures, the resistive memory layer covering at least a portion of side surfaces of the outer surfaces;
a threshold switching layer disposed on the resistive memory layer; and
a second conductive line electrically connected to the threshold switching layer and extending in a second direction that is non-parallel to the first direction.

2. The cross-point array device of claim 1, wherein each of the plurality of pillar structures further comprises a hard mask layer disposed on the memory electrode layer in a third direction that is perpendicular to the first and second directions.

3. The cross-point array device of claim 1, wherein the threshold switching layer fills spaces between the plurality of pillar structures.

4. The cross-point array device of claim 1, wherein the threshold switching layer comprises a trench extending in the second direction, and the second conductive line is disposed inside the trench.

5. The cross-point array device of claim 1, wherein the second conductive line is in contact with side surfaces of the plurality of pillar structures, the second conductive line being electrically insulated from the memory electrode layer.

6. The cross-point array device of claim 1, wherein the memory electrode layer comprises at least one selected from the group consisting of tantalum (Ta), hafnium (Hf), and titanium (Ti).

7. The cross-point array device of claim 1, wherein the resistive memory layer is disposed between the memory electrode layer and the threshold switching layer.

8. The cross-point array device of claim 1, wherein a width of the second conductive line in the first direction is substantially equal to diameters of the plurality of pillar structures in the first direction, and a spacing between second conductive lines is substantially equal to a spacing between two adjacent pillar structures of the plurality of pillar structures in the first direction.

9. The cross-point array device of claim 1, wherein the second conductive line is disposed to be shifted in the first direction from an edge of each of the plurality of pillar structures by less than or equal to ¼ of a pitch of the second conductive line.

10. The cross-point array device of claim 1, wherein the resistive memory layer comprises at least one selected from the group consisting of a titanium oxide, an aluminum oxide, a nickel oxide, a copper oxide, a zirconium oxide, a manganese oxide, a hafnium oxide, a tungsten oxide, a tantalum oxide, a niobium oxide, and an iron oxide.

11. The cross-point array device of claim 1, wherein the resistive memory layer comprises a conductive filament configured to connect the memory electrode layer to the threshold switching layer, the conductive filament comprising oxygen vacancies.

12. The cross-point array device of claim 1, wherein the threshold switching layer comprises at least one of a metal oxide, a metal nitride, and a chalcogenide-based material.

13. A cross-point array device comprising:
a substrate;
a first conductive line disposed over the substrate;
a plurality of pillar structures disposed on the first conductive line, each of the plurality of pillar structures comprising a memory electrode layer;
a resistive memory layer disposed on an outer surface of the plurality of pillar structures;
a threshold switching layer covering the resistive memory layer; and
a second conductive line disposed in a trench in the threshold switching layer and contacting the plurality of pillar structures.

14. The cross-point array device of claim 13, wherein each of the plurality of pillar structures further comprises a hard mask layer disposed on the memory electrode layer.

15. The cross-point array device of claim 13, wherein the threshold switching layer fills spaces between the plurality of pillar structures.

16. The cross-point array device of claim 13, wherein the resistive memory layer is disposed between the memory electrode layer and the threshold switching layer in a direction that is parallel to a top surface of the substrate.

17. A method of manufacturing a cross-point array device, the method comprising:
providing a substrate;
forming a first conductive line extending in a first direction over the substrate;
forming a plurality of pillar structures on the first conductive line, each of the plurality of pillar structures comprising a memory electrode layer;
forming a resistive memory layer on side surfaces of the plurality of pillar structures;
forming a threshold switching layer filling spaces between the plurality of pillar structures, the threshold switching layer being formed on the resistive memory layer;
forming a trench extending in a second direction in the threshold switching layer, the second direction be nonparallel to the first direction; and
forming a second conductive line in the trench.

18. The method of claim 17, wherein the forming of the plurality of pillar structures comprises:
sequentially stacking an electrode film and a hard mask film over the substrate after forming the first conductive line; and
sequentially patterning the hard mask film and the electrode film,
wherein the patterned electrode film is electrically connected to the first conductive line and corresponds to the memory electrode layer.

19. The method of claim 17, wherein the memory electrode layer comprises at least one selected from the group consisting of tantalum (Ta), hafnium (Hf), and titanium (Ti).

20. The method of claim 17, wherein the forming of the threshold switching layer comprises:
forming a switching film to fill the spaces between the plurality of pillar structures over the substrate and to cover the resistive memory layer; and
planarizing the switching film,
wherein the switching film comprises at least one of a metal oxide, a metal nitride, and a chalcogenide-based material.

21. The method of claim 17, wherein the forming of the trench comprises:
selectively etching the threshold switching layer and the resistive memory layer; and
performing a restoration treatment on edge portions of the resistive memory layer that are formed by selectively etching the resistive memory layer.

22. The method of claim 17, wherein the forming of the second conductive line comprises:
forming a conductive film to fill the trench and to cover the threshold switching layer; and
planarizing the conductive film, such that an upper surface of the threshold switching layer and an upper surface of the planarized conductive film are substantially co-planar to each other.

* * * * *